(12) United States Patent
Nakamoto et al.

(10) Patent No.: US 10,636,826 B2
(45) Date of Patent: Apr. 28, 2020

(54) SOLID-STATE IMAGING DEVICE, MANUFACTURING METHOD THEREOF, AND ELECTRONIC DEVICE

(71) Applicant: SONY SEMICONDUCTOR SOLUTIONS CORPORATION, Kanagawa (JP)

(72) Inventors: Yuka Nakamoto, Kumamoto (JP); Yukihiro Sayama, Kumamoto (JP); Nobuyuki Ohba, Kumamoto (JP); Sintaro Nakajiki, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 15 days.

(21) Appl. No.: 15/767,950

(22) PCT Filed: Oct. 12, 2016

(86) PCT No.: PCT/JP2016/080219
§ 371 (c)(1),
(2) Date: Apr. 12, 2018

(87) PCT Pub. No.: WO2017/073321
PCT Pub. Date: May 4, 2017

(65) Prior Publication Data
US 2018/0301491 A1    Oct. 18, 2018

(30) Foreign Application Priority Data
Oct. 26, 2015  (JP) .................................. 2015-209550

(51) Int. Cl.
*H01L 27/146*    (2006.01)
*H01L 27/14*     (2006.01)

(52) U.S. Cl.
CPC ........ *H01L 27/14623* (2013.01); *H01L 27/14* (2013.01); *H01L 27/1463* (2013.01);
(Continued)

(58) Field of Classification Search
CPC ............... H01L 27/14; H01L 27/14621; H01L 27/14623; H01L 27/14685; H01L 27/1463; H01L 27/14645; H01L 27/14627
(Continued)

(56) References Cited

U.S. PATENT DOCUMENTS

2012/0147208 A1   6/2012   Otsuka et al.
2014/0339606 A1   11/2014  Lin et al.
2015/0270298 A1   9/2015   Lin et al.

FOREIGN PATENT DOCUMENTS

CN     102569315 A    7/2012
CN     104167420 A    11/2014
(Continued)

OTHER PUBLICATIONS

International Search Report and Written Opinion of PCT Application No. PCT/JP2016/080219, dated Dec. 13, 2016, 09 pages.

*Primary Examiner* — Hrayr A Sayadian
(74) *Attorney, Agent, or Firm* — Chip Law Group

(57) ABSTRACT

The present technology relates to a solid-state imaging device, a manufacturing method, and an electronic device, which can improve sensitivity while improving color mixing. The solid-state imaging device includes a first wall provided between a pixel and a pixel arranged two-dimensionally to isolate the pixels, in which the first wall includes at least two layers including a light shielding film of a lowermost layer and a low refractive index film of which refractive index is lower than the light shielding film. The (Continued)

present technology can be applied to, for example, a solid-state imaging device, an electronic device having an imaging function, and the like.

16 Claims, 20 Drawing Sheets

(52) U.S. Cl.
CPC .. *H01L 27/14621* (2013.01); *H01L 27/14627* (2013.01); *H01L 27/14645* (2013.01); *H01L 27/14685* (2013.01)

(58) Field of Classification Search
USPC .......................................................... 257/432
See application file for complete search history.

(56) References Cited

FOREIGN PATENT DOCUMENTS

| | | |
|---|---|---|
| CN | 104934452 A | 9/2015 |
| JP | 2008-192951 A | 8/2008 |
| JP | 2012-124377 A | 6/2012 |
| JP | 2013-251292 A | 12/2013 |
| JP | 2014-225667 A | 12/2014 |
| JP | 2015-185844 A | 10/2015 |
| TW | 201230313 A | 7/2012 |
| TW | 201445716 A | 12/2014 |
| TW | 201537735 A | 10/2015 |

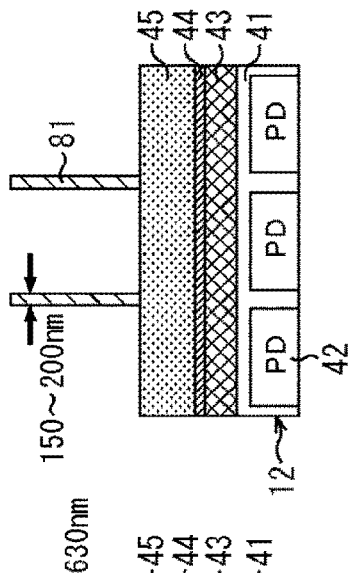 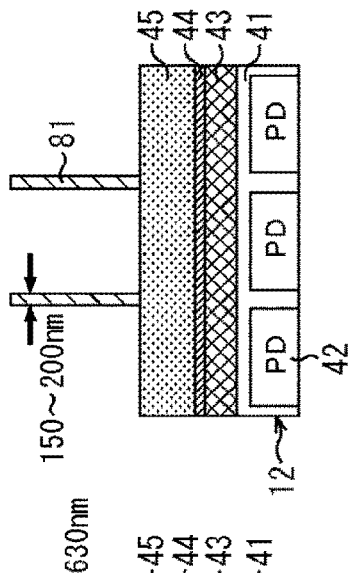 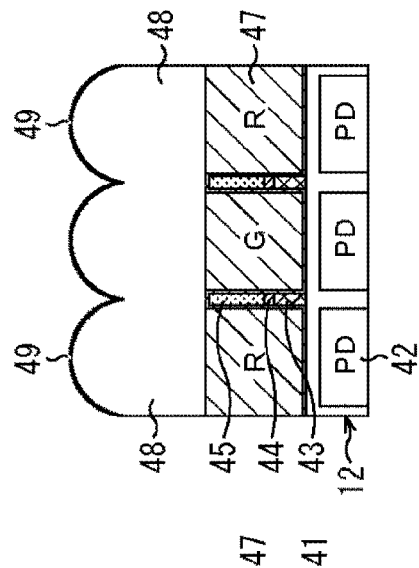
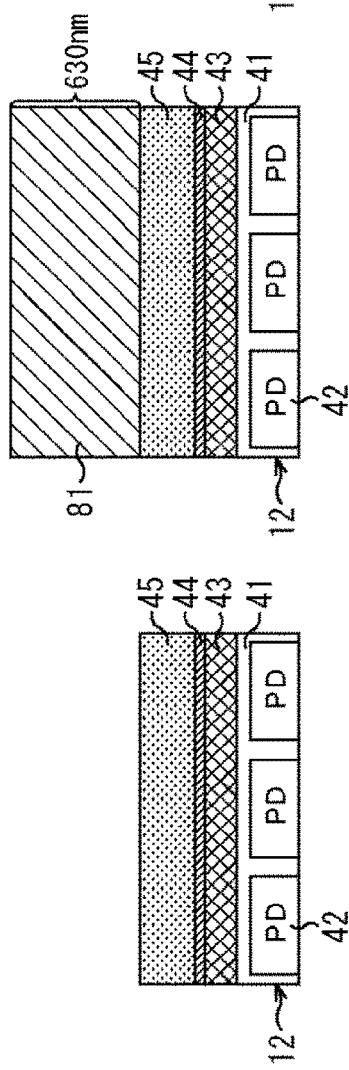 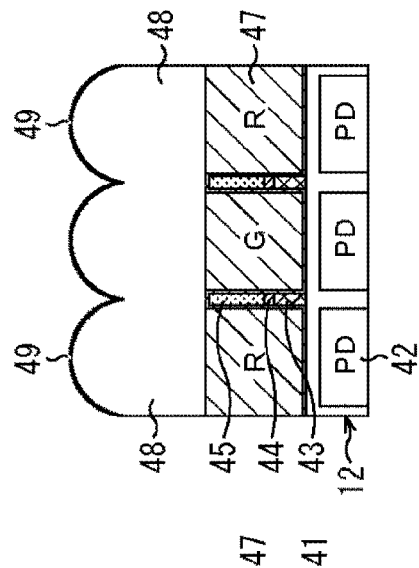 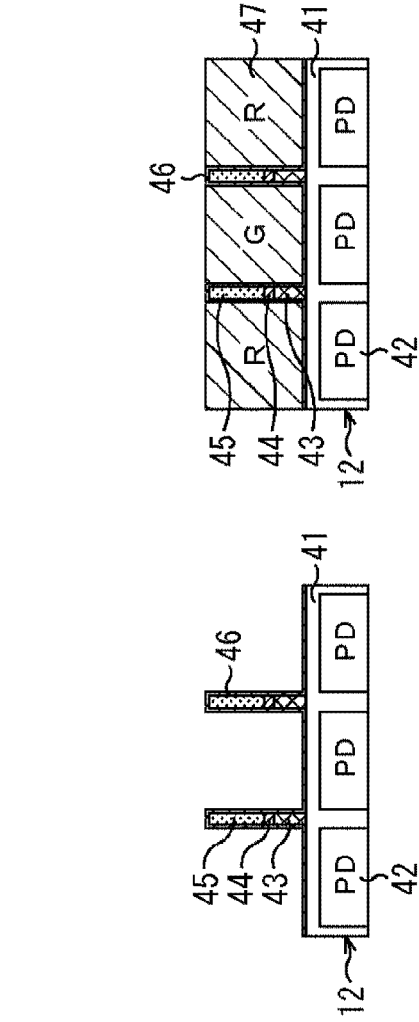

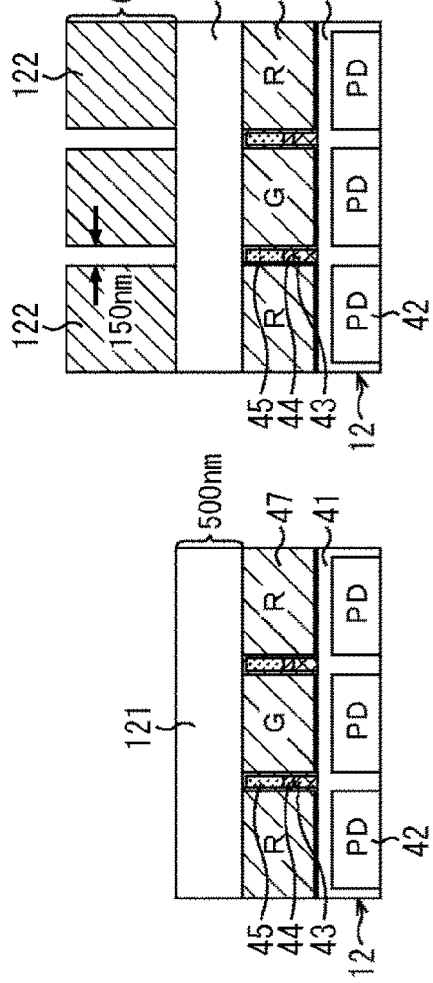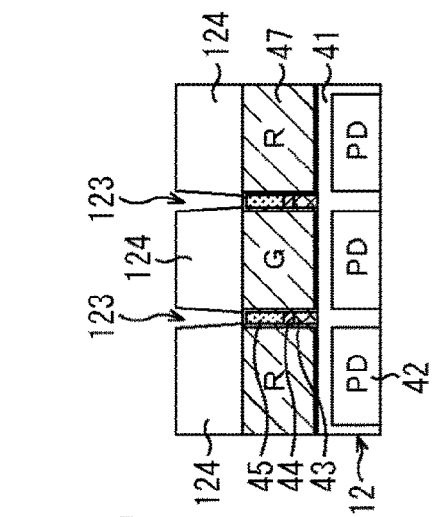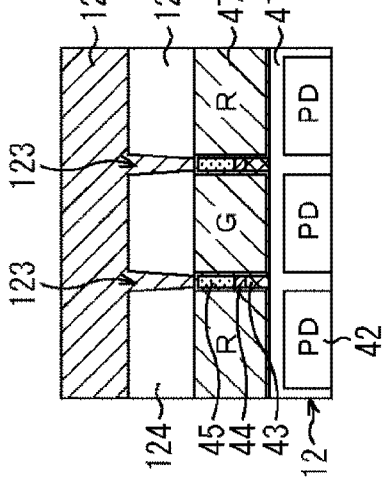

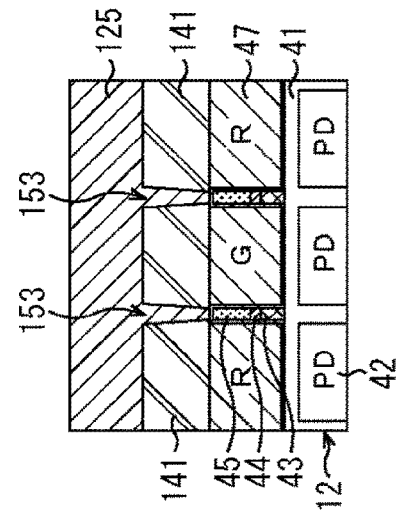
FIG. 16A
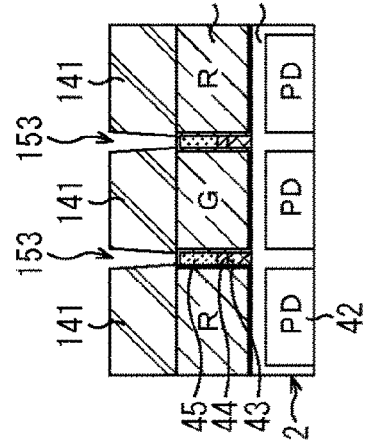
FIG. 16B
FIG. 16C
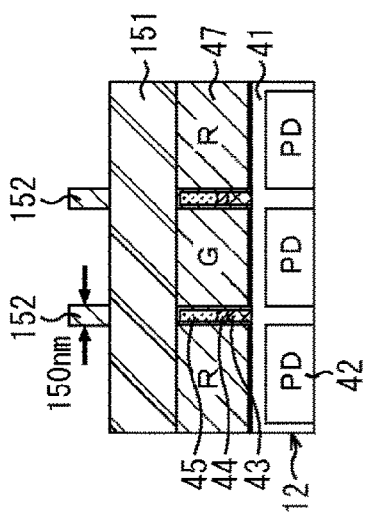
FIG. 16D
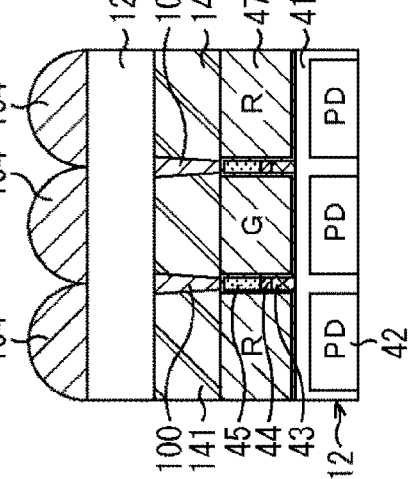
FIG. 16E
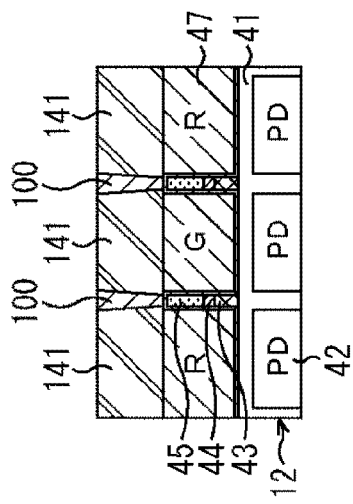
FIG. 16F

SOLID-STATE IMAGING DEVICE, MANUFACTURING METHOD THEREOF, AND ELECTRONIC DEVICE

CROSS REFERENCE TO RELATED APPLICATIONS

This application is a U.S. National Phase of International Patent Application No. PCT/JP2016/080219 filed on Oct. 12, 2016, which claims priority benefit of Japanese Patent Application No. JP 2015-209550 filed in the Japan Patent Office on Oct. 26, 2015. Each of the above-referenced applications is hereby incorporated herein by reference in its entirety.

TECHNICAL FIELD

The present technology relates to a solid-state imaging device, a manufacturing method thereof, and an electronic device, and more particularly, the present technology relates to a solid-state imaging device, a manufacturing method thereof, and an electronic device capable of improving sensitivity while improving color mixing.

BACKGROUND ART

In a solid-state imaging device such as a CMOS image sensor, light incident on an on-chip lens (microlens) of any given pixel obliquely enters into an adjacent pixel, thereby causing color mixing. Therefore, for example, in the solid-state imaging device of Patent Document 1, a structure is proposed in which color mixing is prevented by providing a partition wall between color filters of adjacent pixels and between microlenses.

CITATION LIST

Patent Document

Patent Document 1: Japanese Patent Application Laid-Open No. 2013-251292

SUMMARY OF THE INVENTION

Problems to be Solved by the Invention

However, simply making the partition wall higher between the pixels improves color mixing, but the sensitivity is greatly reduced.

The present technology has been made in view of such a situation, and is to improve the sensitivity while improving the color mixing.

Solutions to Problems

A solid-state imaging device according to a first aspect of the present technology includes a first wall provided between a pixel and a pixel arranged two-dimensionally to isolate the pixels, in which the first wall includes at least two layers including a light shielding film of a lowermost layer and a low refractive index film of which refractive index is lower than the light shielding film.

In a manufacturing method of a solid-state imaging device according to a second aspect of the present technology, a first wall is formed between a pixel and a pixel arranged two-dimensionally to isolate the pixels, and the first wall includes at least two layers including a light shielding film of a lowermost layer and a low refractive index film of which refractive index is lower than the light shielding film.

An electronic device according to a third aspect of the present technology includes a solid-state imaging device including a first wall provided between a pixel and a pixel arranged two-dimensionally to isolate the pixels, in which the first wall includes at least two layers including a light shielding film of a lowermost layer and a low refractive index film of which refractive index is lower than the light shielding film.

In the first to third aspects of the present technology, a first wall is formed between a pixel and a pixel arranged two-dimensionally to isolate the pixels, and the first wall includes at least two layers including a light shielding film of a lowermost layer and a low refractive index film of which refractive index is lower than the light shielding film.

The solid-state imaging device and the electronic device may be an independent device or a module incorporated in another device.

Effects of the Invention

According to the first to third aspects of the present technology, sensitivity can be improved while improving color mixing.

It should be noted that the effects described herein are not necessarily limited, and any of the effects described in the present disclosure may be applied.

BRIEF DESCRIPTION OF DRAWINGS

FIGS. 7A, 7B, 7C, 7D, 7E, and 7F are diagrams for explaining a manufacturing method (first manufacturing method) of a pixel according to the first embodiment.

FIGS. 11A, 11B, 11C, 11D, 11E, and 11F are figures for explaining a manufacturing method (second manufacturing method) of a pixel according to the second embodiment.

FIG. 15 is a figure showing relationship between the refractive indexes of the first wall, the second wall, and the like.

FIGS. 16A, 16B, 16C, 16D, 16E, and 16F are figures for explaining a manufacturing method (third manufacturing method) of a pixel according to the third embodiment.

MODE FOR CARRYING OUT THE INVENTION

Figure 1:
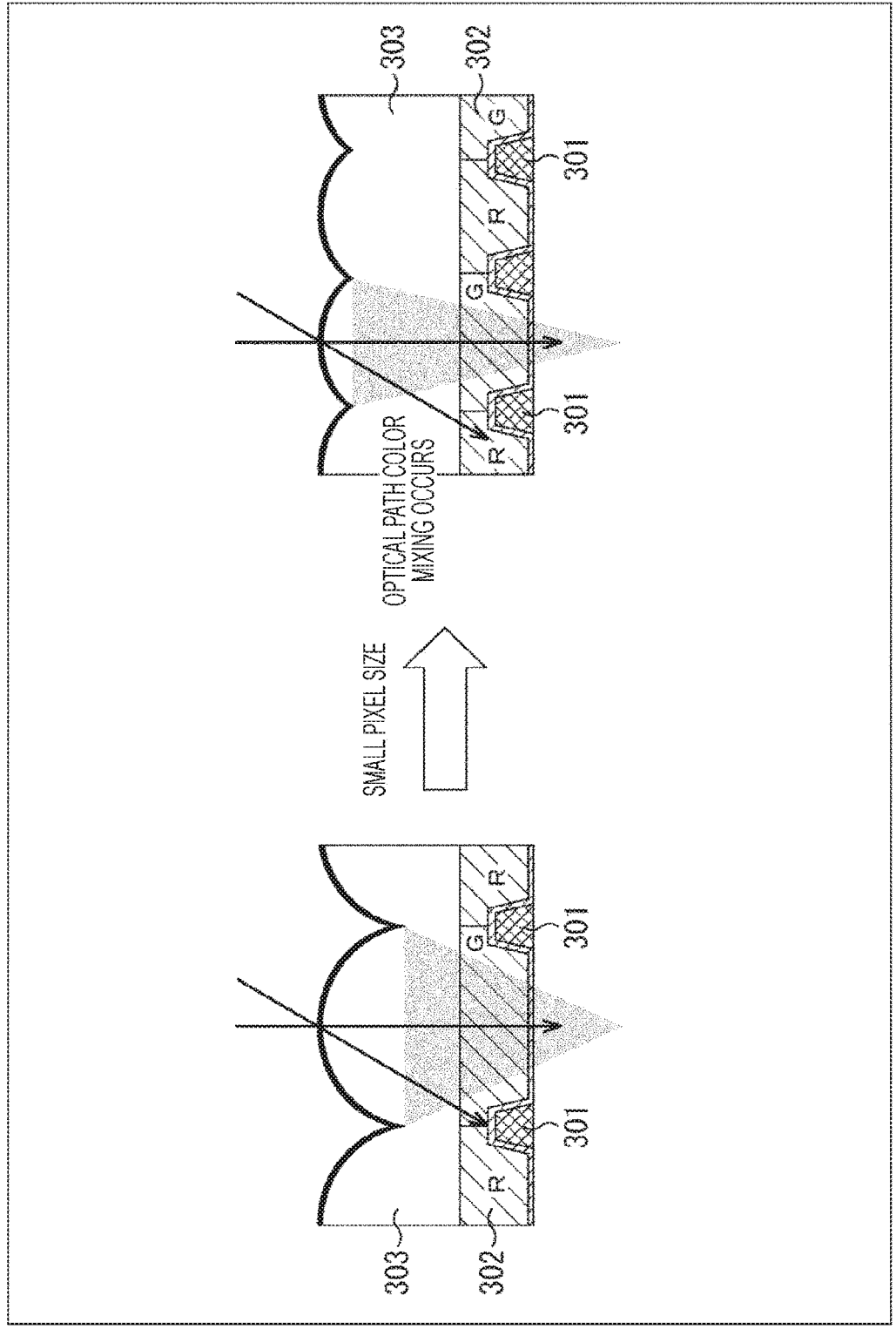
FIG. 1 is a diagram for explaining a problem of an optical path color mixing.

Hereinafter, a mode (hereinafter referred to as "embodiment") for implementing the present technology will be described. Furthermore, the description will be given in the following order.
1. Problems of optical path color mixing of solid-state imaging device
2. Schematic configuration example of solid-state imaging device
3. Pixel structure of first embodiment (configuration example having first wall)
4. Manufacturing method of pixel structure according to first embodiment
5. Modification of pixel structure according to first embodiment
6. Pixel structure according to second embodiment (first configuration example having first wall and second wall)
7. Manufacturing method of pixel structure according to second embodiment
8. Modification of pixel structure according to second embodiment
9. Pixel structure of third embodiment (second configuration example having first wall and second wall)
10. Manufacturing method of pixel structure according to third embodiment
11. Modification of pixel structure according to third embodiment
12. Actions and effects of first wall and second wall
13. Application example to electronic device
<1. Problems of Optical Path Color Mixing of Solid-State Imaging Device>

First, problems of optical path color mixing associated with a solid-state imaging device such as a CMOS image sensor will be explained with reference to FIG. 1 to FIG. 3.

Generally, for example, color filters of red (R), green (G), or blue (b) are arranged by a Bayer arrangement or the like in each pixel repeatedly formed in an array in the row direction and the column direction in a solid-state imaging device, and each pixel is configured to receive light of a different wavelength (color).

In order for each pixel to attain specific spectroscopy, a color filter is required to have a certain film thickness. In addition, in order to satisfy the convergence, the on-chip lens is required to have a certain lens height. Therefore, for example, in order to improve image resolution, as shown in FIG. 1, in a case where the pixel size is reduced, the aspect ratio which is the ratio between the horizontal direction and the depth direction of pixel is deteriorated, and the light incident on an on-chip lens 303 of the pixel in which a G color filter 302 is disposed exceeds an inter-pixel light shielding film 301 formed at the pixel boundary and is incident on an R color filter 302 of the adjacent pixel, and optical path color mixing occurs.

Figure 2:
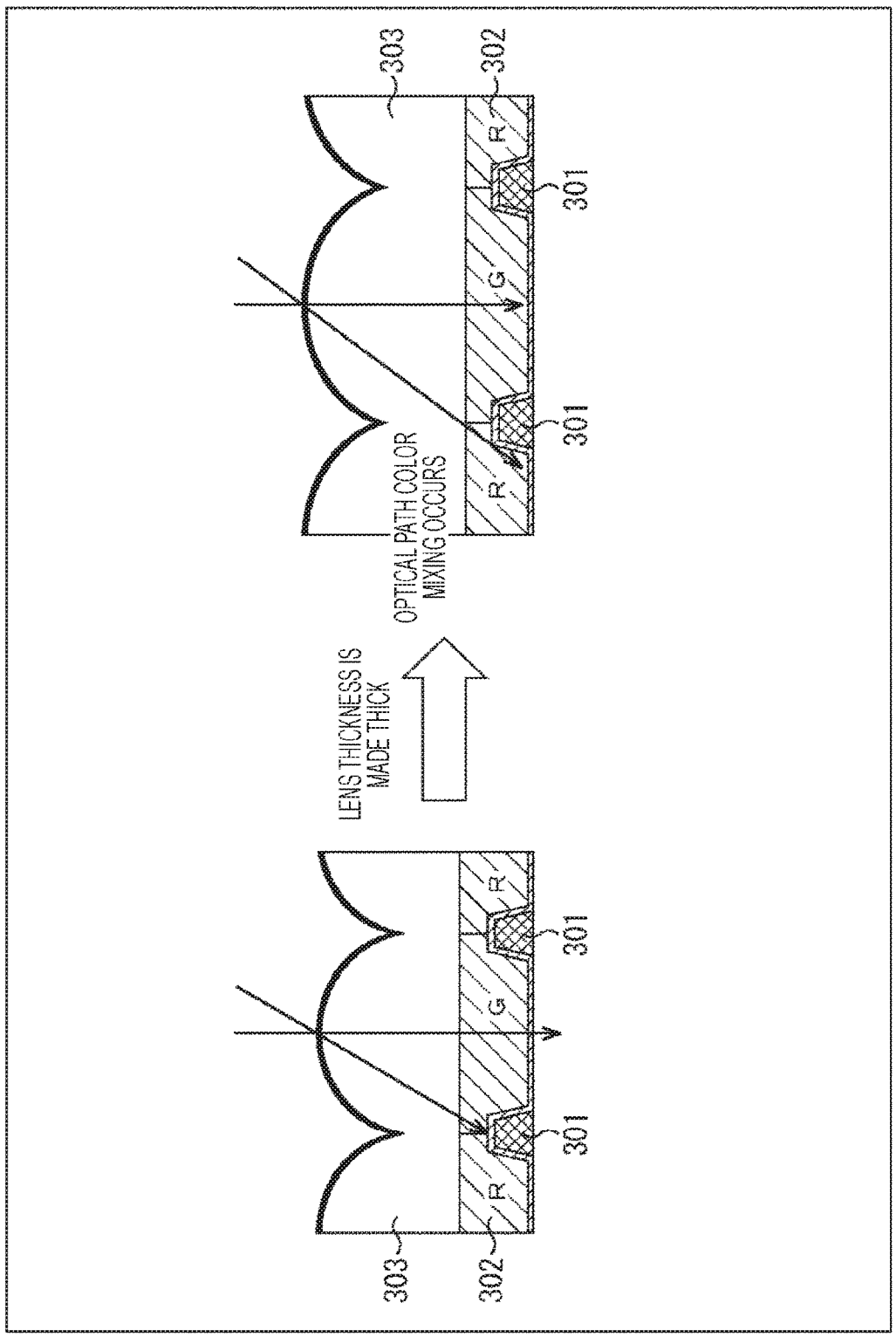
FIG. 2 is a diagram for explaining a problem of an optical path color mixing.

In addition, even in a case where the pixel size is not changed, as shown in FIG. 2, a larger lens height of the on-chip lens 303 causes more oblique light to leak into the adjacent pixels, and therefore, optical path color mixing also occurs in this case.

Figure 3:
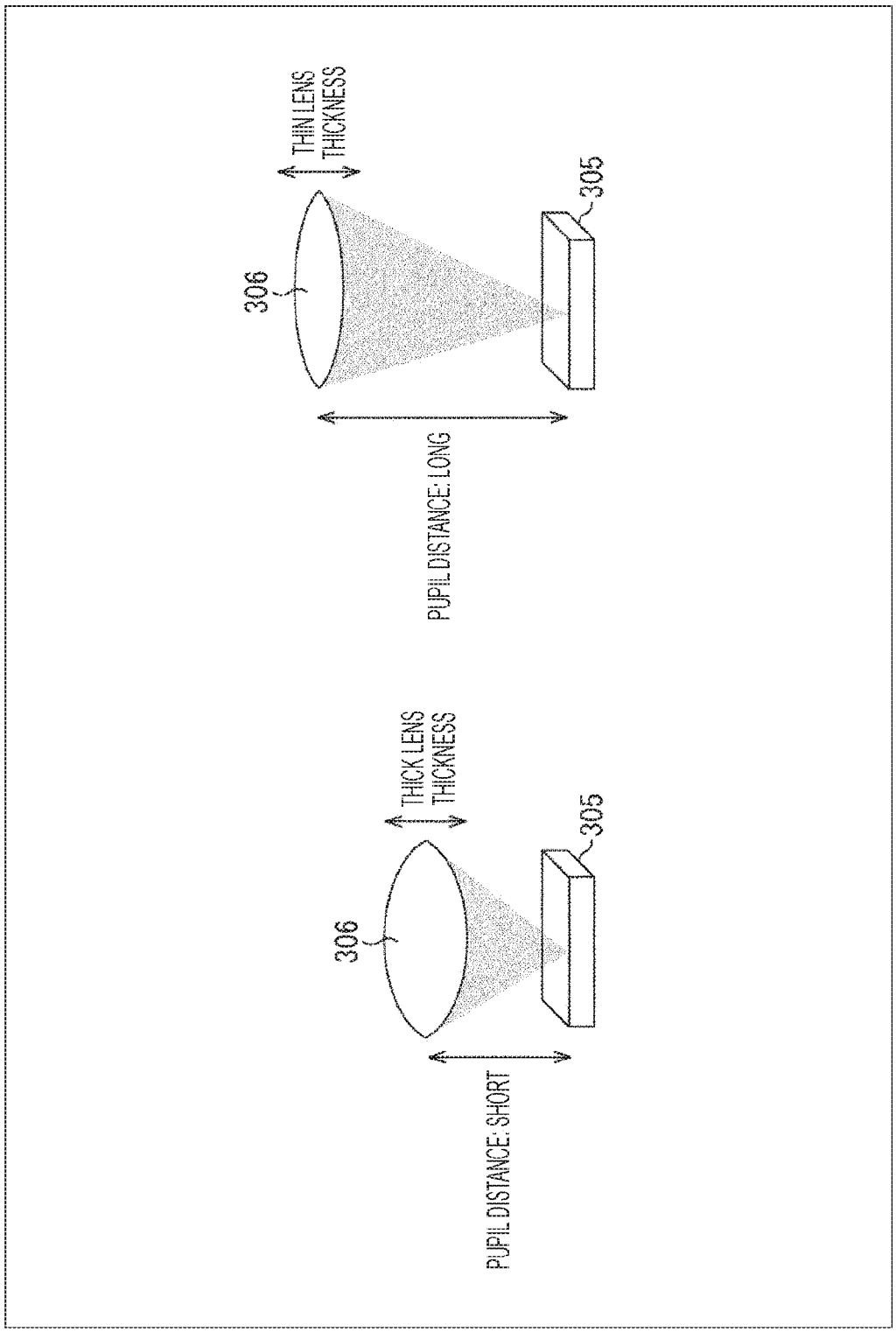
FIG. 3 is a diagram for explaining a problem of an optical path color mixing.

Furthermore, in the relationship between a CMOS image sensor chip 305 and a condenser lens 306 shown in FIG. 3, the use of the condenser lens 306 whose distance (pupil distance) from the condenser lens 306 to the CMOS image sensor chip 305 is shortened will increase the incident angle of the principal ray of the incident light in the peripheral portion of the CMOS image sensor chip 305. As a result, incident light is likely to enter into adjacent pixels, and shading occurs in which the peripheral portion of the CMOS image sensor chip 305 becomes darker than the central portion.

Pupil correction that deviates the center of the light receiving region of each pixel from the center of the on-chip lens can improve shading of oblique incident light but cannot correct shading of scattered light sufficiently.

Optical path color mixing can be improved by forming the height of the inter-pixel light shielding film 301 to be high, for example, as high as the film thickness of the color filter 302, but the sensitivity is greatly reduced.

Therefore, in the following description, a solid-state imaging device adopting a pixel structure that improves sensitivity while improving color mixing will be explained.
<2. Schematic Configuration Example of Solid-State Imaging Device>

Figure 4:
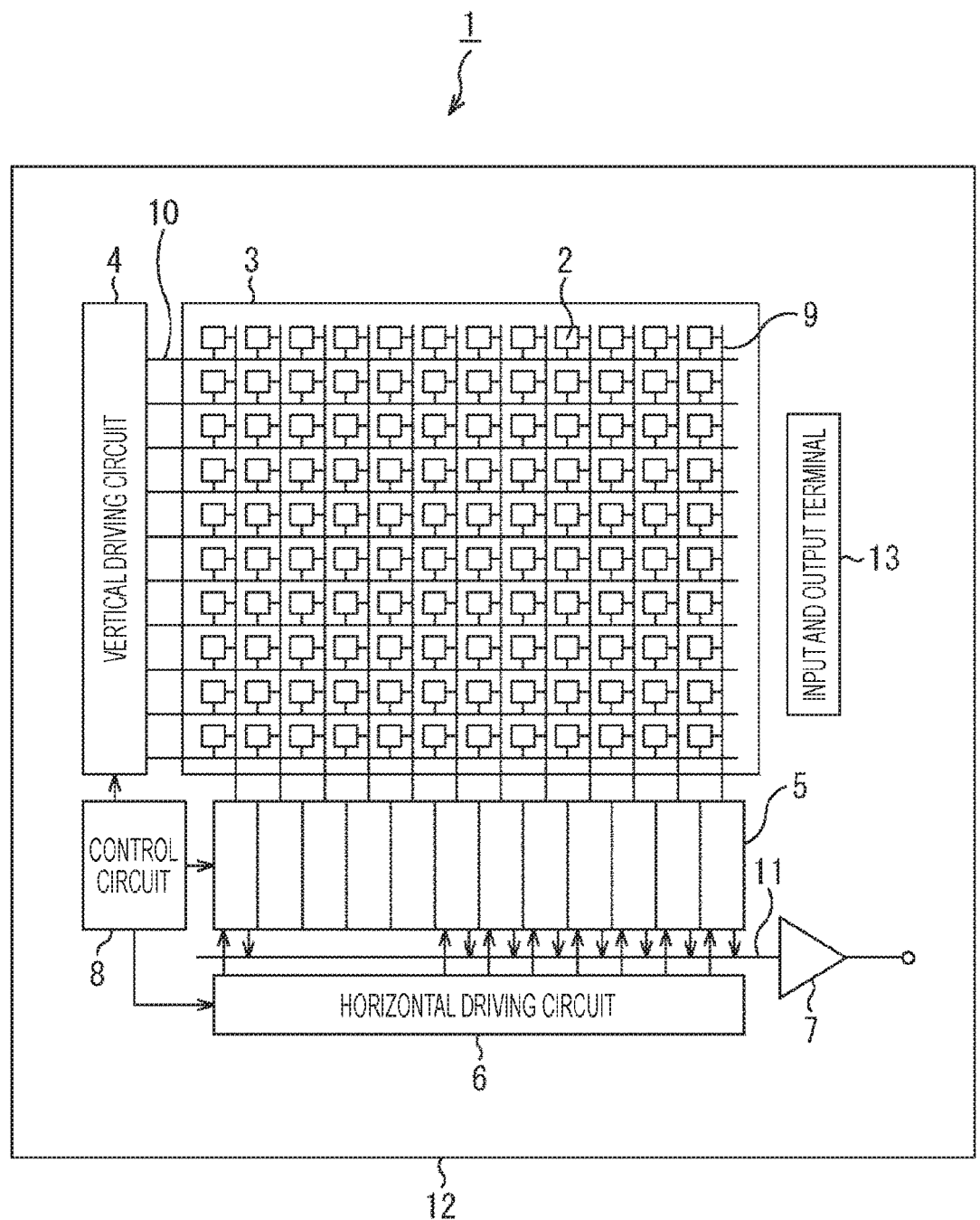
FIG. 4 is a diagram showing a schematic configuration of a solid-state imaging device to which the present technology is applied.

FIG. 4 shows a schematic configuration of a solid-state imaging device to which the present technology is applied.

The solid-state imaging device 1 of FIG. 4 has a pixel array unit 3 in which pixels 2 are two-dimensionally arranged in a matrix on a semiconductor substrate 12 using, for example, silicon (Si) as a semiconductor, and a peripheral circuit unit therearound. The peripheral circuit unit includes a vertical driving circuit 4, a column signal processing circuit 5, a horizontal driving circuit 6, an output circuit 7, a control circuit 8, and the like.

The pixel 2 includes a photodiode as a photoelectric conversion unit and a plurality of pixel transistors. The plurality of pixel transistors include, for example, four MOS transistors, i.e., a transfer transistor, a selection transistor, a reset transistor, and an amplification transistor.

In addition, the pixel 2 can also have a shared pixel structure. This shared pixel structure includes a plurality of photodiodes, a plurality of transfer transistors, one shared floating diffusion (floating diffusion region), and one other shared pixel transistor. More specifically, in the shared pixel structure, photodiodes and transfer transistors constituting a plurality of unit pixels share one other pixel transistor.

The control circuit 8 receives an input clock, data instructing an operation mode and the like, and outputs data such as internal information of the solid-state imaging device 1. More specifically, on the basis of a vertical synchronization signal, a horizontal synchronization signal, and a master clock, the control circuit 8 generates clock signals and control signals which are the basis of operations of the vertical driving circuit 4, the column signal processing circuit 5, the horizontal driving circuit 6 and the like. Then, the control circuit 8 outputs the generated clock signal and control signal to the vertical driving circuit 4, the column signal processing circuit 5, the horizontal driving circuit 6, and the like.

The vertical driving circuit 4 is constituted by, for example, a shift register, and selects a predetermined pixel driving wire 10 to supply a pulse for driving the pixel 2 to the selected pixel driving wire 10, and drives the pixels 2 in units of rows. More specifically, the vertical driving circuit 4 sequentially selects and scans the pixels 2 of the pixel array unit 3 in the vertical direction in units of rows, and supplies a pixel signal based on the signal charge generated according to the amount of received light in the photoelectric conversion unit of each pixel 2 to the column signal processing circuit 5 through a vertical signal line 9.

The column signal processing circuit 5 is arranged for each column of pixels 2 and performs, for each pixel column, signal processing such as denoising of the signal output from the pixels 2 in one row. For example, the column signal processing circuit 5 performs signal processing such as Correlated Double Sampling (CDS) and AD conversion for removing pixel unique fixed pattern noise.

The horizontal driving circuit 6 is constituted by, for example, a shift register, and sequentially selects each of the column signal processing circuits 5 by sequentially outputting horizontal scanning pulses, and outputs a pixel signal from each of the column signal processing circuits 5 to a horizontal signal line 11.

The output circuit 7 performs signal processing on the signals sequentially supplied from each of the column signal processing circuits 5 through the horizontal signal line 11 and outputs the signals. For example, the output circuit 7 may only perform buffering, or may perform black level adjustment, column variation correction, various digital signal processing, and the like in some cases. An input and output terminal 13 exchanges signals with the outside.

The solid-state imaging device 1 configured as described above is a CMOS image sensor having a column ADC structure in which a column signal processing circuit 5 performing CDS processing and AD conversion processing is arranged for each pixel column.

<3. Pixel Structure of First Embodiment>

Figure 5:
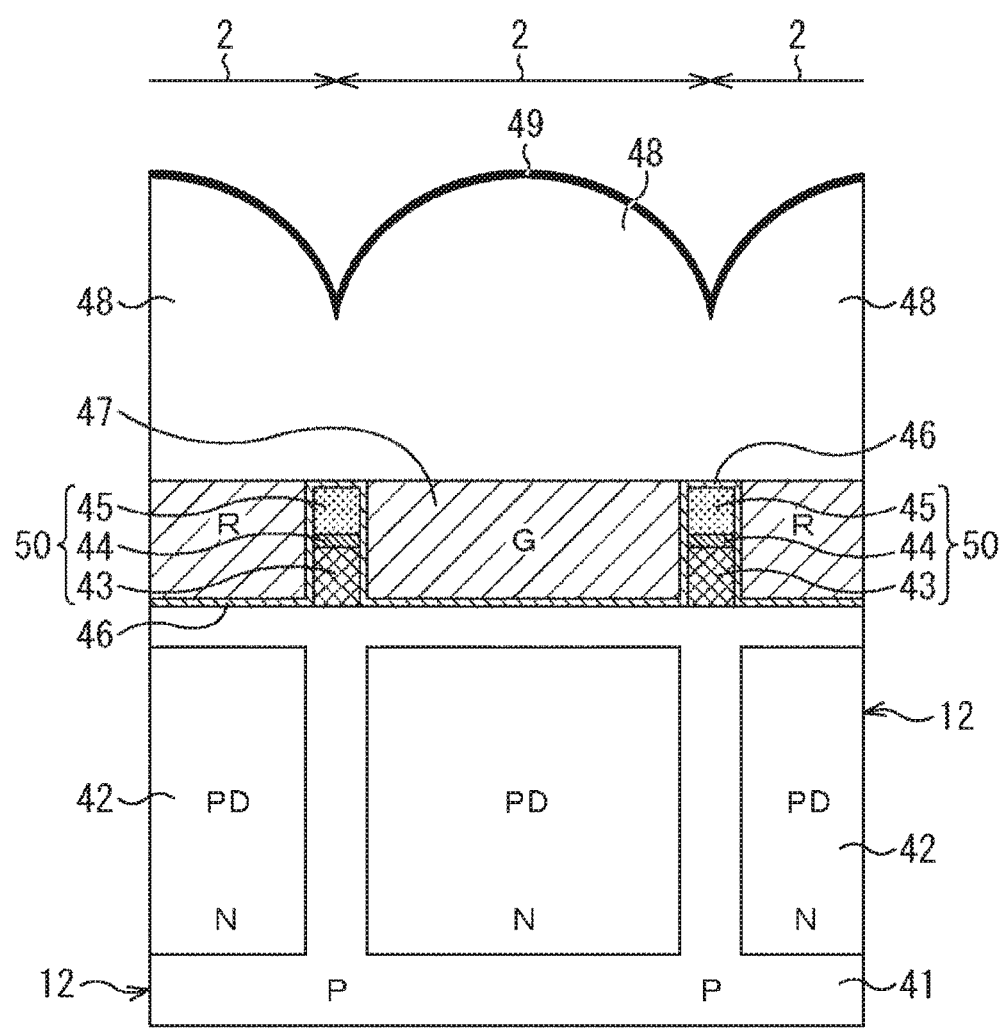
FIG. 5 is a cross-sectional view showing a pixel structure according to a first embodiment.

FIG. 5 is a cross-sectional view showing the pixel structure of the first embodiment adopted as the structure of the pixel 2 of the solid-state imaging device 1.

The semiconductor substrate 12 includes, for example, silicon (Si) and is formed to have a thickness of, for example, 1 to 6 μm. In the semiconductor substrate 12, for example, an N-type (second conductivity type) semiconductor region 42 is formed in a P-type (first conductivity type) semiconductor region 41 for each pixel 2 so that photodiodes PD are formed in units of pixels.

The upper side of FIG. 5 is the backside of the semiconductor substrate 12 to which light is incident, and the lower side of FIG. 5 is the front side of the semiconductor substrate 12 on which pixel transistors (not shown) and multilayer wiring layers are formed. Therefore, the solid-state imaging device 1 adopting the pixel structure of FIG. 5 is a back-illuminated CMOS image sensor in which light enters from the backside of the semiconductor substrate 12.

At the boundary portion between the adjacent pixels 2 on the substrate of the backside of the semiconductor substrate 12 which is the upper side in the figure, a light shielding film 43 for preventing the incident light from leaking into the adjacent pixel is formed, and a first low refractive index film 44 and a second low refractive index film 45 having a refractive index lower than that of the light shielding film 43 are laminated on the light shielding film 43.

The material constituting the light shielding film 43 may be of any material as long as the material blocks light. For example, a metal film of tungsten (W), aluminum (Al), copper (Cu) or the like or an oxidized film thereof can be used. Furthermore, the material constituting the light shielding film 43 maybe an organic resin material internally containing a carbon black pigment or a titanium black pigment.

Furthermore, the light shielding film 43 is formed by stacking a plurality of metal films. For example, the light shielding film 43 may include a laminated structure including tungsten (W) formed with a film thickness of about 200 nm as a lower layer and titanium (Ti) formed with a film thickness of about 30 nm as an upper layer.

The first low refractive index film 44 and the second low refractive index film 45 may include, for example, an inorganic film such as SiN, $SiO_2$, SiON, and a resin material (organic film) such as a styrene resin, an acrylic resin, a styrene-acrylic copolymer resin, or a siloxane resin.

In the present embodiment, the first low refractive index film 44 includes, for example, SiN formed with a film thickness of about 50 nm, and the second low refractive index film 45 includes $SiO_2$ formed with a film thickness of about 550 nm, for example.

Furthermore, in the following description, the three layers of the light shielding film 43, the first low refractive index film 44, and the second low refractive index film 45 are collectively referred to as a first wall 50, and the first wall 50 at the boundary portion between the adjacent pixels separates the pixels. For example, the height of the first wall 50 is set within a range of 50 to 2000 nm, and the width of the first wall 50 is set within a range of 50 to 300 nm, which is appropriately set according to the pixel size and the like.

In addition, the laminated surface of the first wall 50 and the backside upper surface of the semiconductor substrate 12 not having the first wall 50 formed thereon are covered with a protective film 46 such as Si oxide film. The protective film 46 is a film for preventing corrosion, and can be formed with a film thickness of, for example, about 50 to 150 nm, but it is not always necessary to form the protective film 46.

A color filter 47 of any one of red (R), green (G), or blue (B) is formed above the photodiode PD on the backside of the semiconductor substrate 12 with the protective film 46 interposed therebetween. The height (film thickness) of the color filter 47 and the height of the first wall 50 are formed to be the same. In a case where the protective film 46 is formed, the combined height of the protective film 46 and the first wall 50 and the height of the color filter 47 are formed to be the same.

On the upper side of the layer of the first wall 50 and the color filter 47, an on-chip lens 48 is formed for each pixel 2. The on-chip lens 48 includes a resin material such as a styrene resin, an acrylic resin, a styrene-acrylic copolymer resin, or a siloxane resin, for example. The incident light is condensed by the on-chip lens 48, and the condensed light is efficiently incident on the photodiode PD via the color filter 47. In addition, an antireflection film 49 is formed on the surface layer of the on-chip lens 48.

Figure 6:
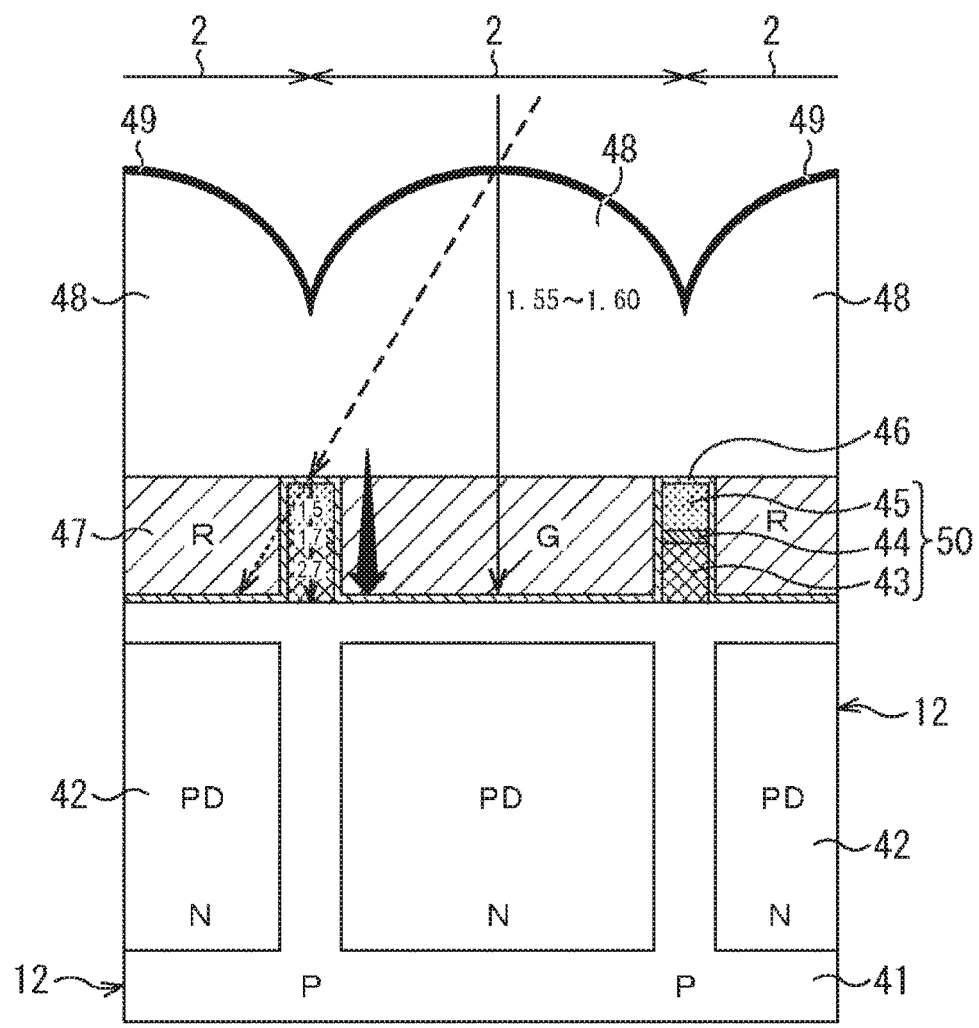
FIG. 6 is a diagram for explaining the refractive index of the first wall.

FIG. 6 shows the refractive index of the first wall 50.

Of the light shielding film 43, the first low refractive index film 44, and the second low refractive index film 45, the second low refractive index film 45 closest to the on-chip lens 48 is the film having the lowest refractive index. The refractive index increases as getting closer to the semiconductor substrate 12 in the following order: the first low refractive index film 44, and the shielding film 43.

Specifically, in a case where the second low refractive index film 45 includes $SiO_2$, the first low refractive index film 44 includes SiN, and the light shielding film 43 includes a titanium/tungsten (Ti/W) double layer structure, the refractive index of the second low refractive index film 45 is about 1.5, the refractive index of the first low refractive index film 44 is about 1.7, and the refractive index of the light shielding film 43 is about 2.7.

Note that the refractive indexes of the first low refractive index film 44 and the second low refractive index film 45 are appropriately set within a range of about 1.00 to 1.70, for example, according to the pixel size and the like.

The refractive index of the on-chip lens 48 can be appropriately set within the range of 1.50 to 2.0, but the refractive index of the on-chip lens 48 is, for example, about 1.55 to 1.60 in the example of FIG. 6.

In this manner, on the light shielding film 43 formed at the boundary of each pixel 2 two-dimensionally arranged in the pixel array unit 3, the low refractive index films (first low refractive index film 44 and second low refractive index film 45) having lower refractive indexes than the light shielding film 43 are stacked, so that it is possible to improve the sensitivity while suppressing color mixing. The degree of improvement of color mixing level and sensitivity level in the pixel structure according to the present technology will be described later with reference to FIG. 18 together with other pixel structures described later.

<4. Manufacturing Method of Pixel Structure According to First Embodiment>

A manufacturing method (first manufacturing method) of the pixel 2 according to the first embodiment will be explained with reference to FIGS. 7A, 7B, 7C, 7D, 7E, and 7F.

First, as shown in FIG. 7A, the light shielding film 43, the first low refractive index film 44, and the second low refractive index film 45 are sequentially formed on the backside upper surface of the semiconductor substrate 12 on which the photodiode PD is formed.

As described above, for example, the light shielding film 43 includes two layers of metal films having titanium (Ti) having a film thickness of about 30 nm as an upper layer and tungsten (W) having a film thickness of about 200 nm as a lower layer. The first low refractive index film 44 includes, for example, SiN formed with a film thickness of about 50 nm and the second low refractive index film 45 includes $SiO_2$ formed with a film thickness of about 550 nm, for example.

Next, as shown in FIG. 7B, a photoresist 81 with a film thickness of about 630 nm is coated on the upper surface of the second low refractive index film 45, and as shown in FIG. 7C, by lithography technique, the photoresist 81 is patterned so that only the pixel boundary portion is left with a width of about 150 to 200 nm.

Then, as shown in FIG. 7D, by performing dry etching processing on the basis of the patterned photoresist 81, the light shielding film 43, first low refractive index film 44, and second low refractive index film 45 are removed until the backside upper surface of the semiconductor substrate 12 is exposed. Thereafter, the photoresist 81 is removed, and the protective film 46 such as Si oxide film is formed on the entire surface. The film thickness of the protective film 46 is, for example, about 50 nm.

Next, as shown in FIG. 7E, the color filter 47 is formed on the upper surface of the semiconductor substrate 12 above the photodiode PD in a predetermined RGB arrangement such as a Bayer arrangement.

Next, as shown in FIG. 7F, the on-chip lens 48 is formed on the upper side of the color filter 47, and the antireflection film 49 is formed on the surface of the on-chip lens 48. The on-chip lens 48 can be formed, for example, by patterning a photosensitive resin material by a lithography technique and then deforming the photosensitive resin material into a lens shape by reflow processing. Alternatively, the on-chip lens 48 may be formed by an etch-back method.

As a result of the above steps, the pixel 2 of the pixel structure shown in FIG. 5 is completed.

<5. Modification of Pixel Structure of First Embodiment>

Figure 8:
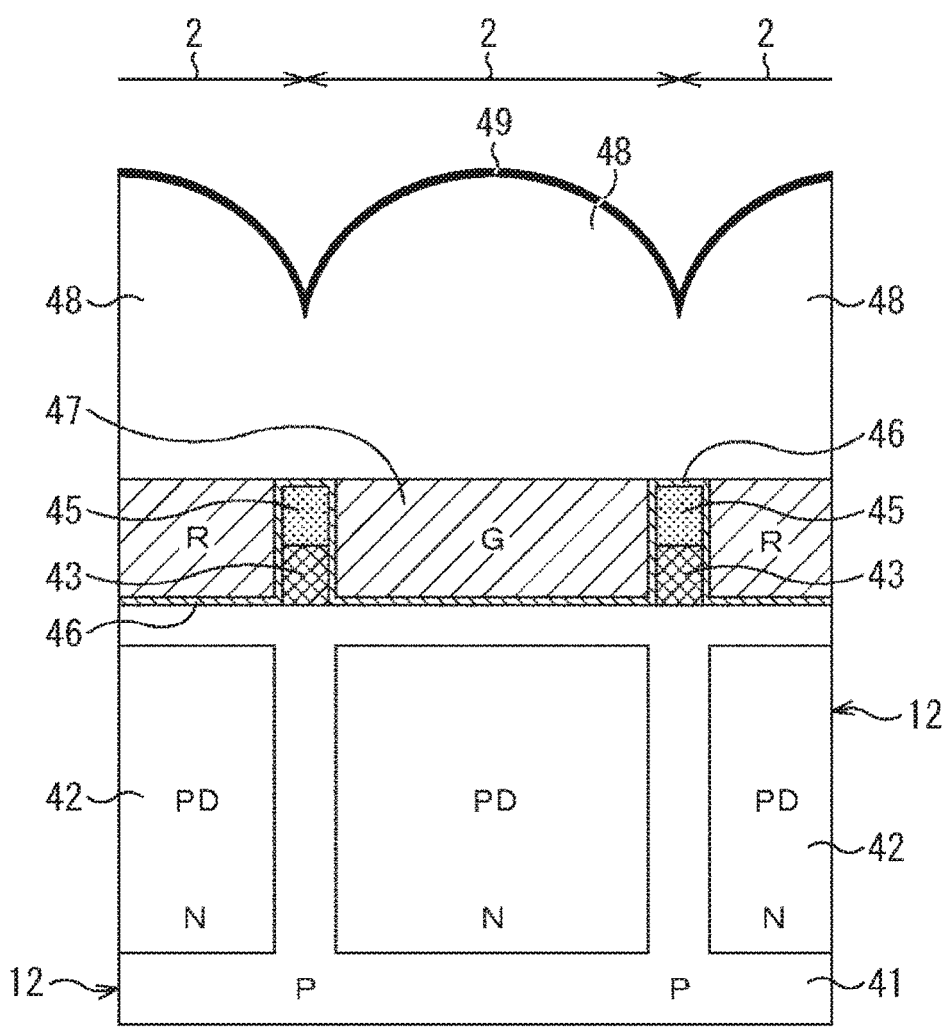
FIG. 8 is a cross-sectional view of pixels showing a modification of the pixel structure according to the first embodiment.

FIG. 8 is a cross-sectional view of pixels 2 showing a modification of the pixel structure according to the first embodiment. In FIG. 8, the parts corresponding to FIG. 5 are denoted with the same reference numerals, and the description about those parts is omitted.

In the pixel structure shown in FIG. 5, the first wall 50 included three layers including the light shielding film 43, the first low refractive index film 44, and the second low refractive index film 45. In the pixel 2 of FIG. 8, the first low refractive index film 44 is omitted, and the first wall 50 includes two layers including the light shielding film 43 and the second low refractive index film 45.

As described above, the first wall 50 may include two layers including the light shielding film 43 of the lowermost layer. In this case, also, the refractive index of second low refractive index film 45 is about 1.5, and the refractive index of light shielding film 43 is about 2.7. Therefore, the first wall 50 is formed so that the refractive index increases sequentially from the on-chip lens 48 to the semiconductor substrate 12.

In addition, the first wall 50 may include three or more layers including the lowermost light shielding film 43, and also in that case, the first wall 50 is formed so that the refractive index increases sequentially from the on-chip lens 48 to the semiconductor substrate 12.

<6. Pixel Structure of Second Embodiment>

Figure 9:
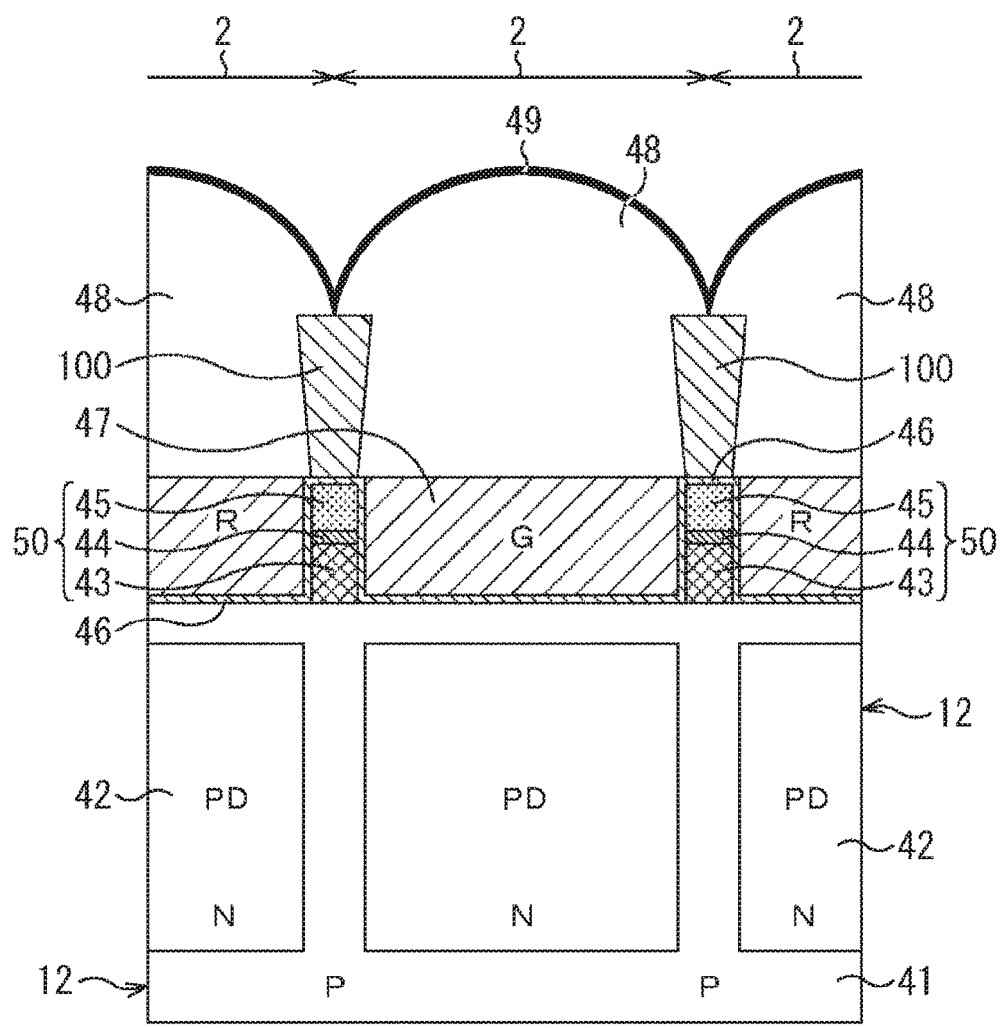
FIG. 9 is a cross-sectional view showing a pixel structure of a second embodiment.

FIG. 9 is a cross-sectional view showing a pixel structure of a second embodiment adopted as the structure of a pixel 2 of a solid-state imaging device 1.

In FIG. 9, the parts corresponding to the first embodiment described above are denoted with the same reference numerals, and the description about those parts is omitted as necessary.

In the second embodiment, on the upper side of a first wall 50, a second wall 100 is further formed so as to separate an on-chip lens 48 of each pixel 2. As shown in FIG. 9, the cross-sectional shape of the second wall 100 is a reverse trapezoid (inverse tapered) shape in which the width of the top where the light enters is the widest and the width becomes thinner toward a semiconductor substrate 12. Alternatively, the cross-sectional shape of the second wall 100 may have a shape in which the top width and the bottom width at the first wall 50 are substantially the same width.

Figure 10:
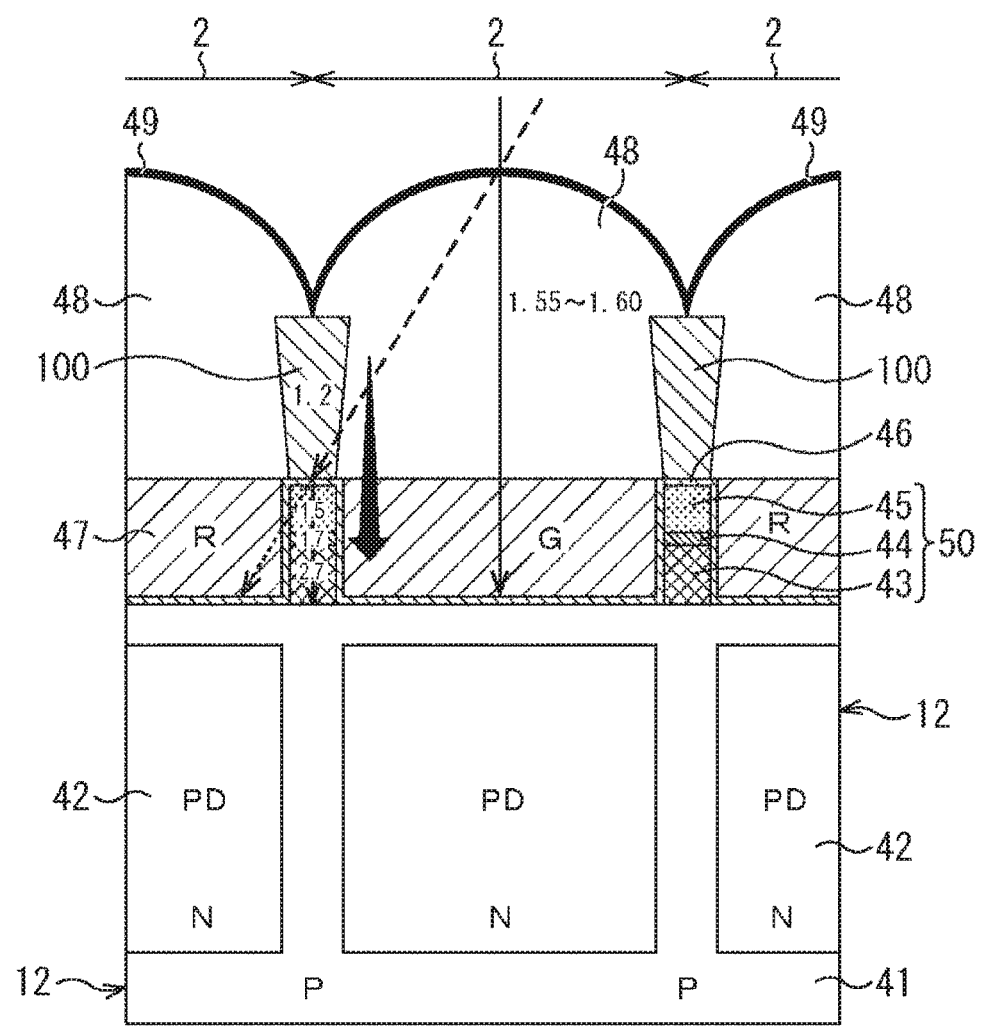
FIG. 10 is a figure showing relationship between the refractive indexes of the first wall and a second wall.

FIG. 10 shows a relationship between the refractive index of the first wall 50 and the refractive index of the second wall 100.

The material of the second wall 100 is selected so that the refractive index of the second wall 100 is within the range of, for example, about 1.2 to 1.7 and lower than a second low refractive index film 45 of the first wall 50. In addition, the material of the second wall 100 is selected so that the refractive index is lower than the adjacent on-chip lens 48.

The material of the second wall 100 includes, for example, an oxidized film (inorganic film) such as $SiO_2$, and a highly transparent resin material (organic film) such as a styrene resin, an acrylic resin, a styrene-acrylic copolymer resin, or a siloxane resin.

For example, as shown in FIG. 10, when it is assumed that: the refractive index of the second low refractive index film 45 of the first wall 50 is about 1.5; the refractive index of a first low refractive index film 44 is about 1.7; the refractive index of a light shielding film 43 is about 2.7, then, the second wall 100 is formed using an organic material having a refractive index of about 1.2.

Even in a case where the entire two walls including the first wall 50 and the second wall 100 is considered, the first wall 50 and the second wall 100 are arranged so that the refractive index increases sequentially from the on-chip lens 48 to the semiconductor substrate 12. Incidentally, the refractive index of the on-chip lens 48 is, for example, about 1.55 to 1.60 in a similar manner as the first embodiment.

In this manner, the first wall 50 of the same layer as a color filter 47 and the second wall 100 formed in the layer of the on-chip lens 48 are formed on the boundary portion of each pixel 2 two-dimensionally arranged in a pixel array unit 3 with a low refractive index film having a low refractive index, so that the sensitivity can be improved while suppressing color mixing.

<7. Manufacturing Method of Pixel Structure of Second Embodiment>

A manufacturing method (second manufacturing method) of a pixel 2 according to the second embodiment will be described with reference to FIGS. 11A, 11B, 11C, 11D, 11E, and 11F.

The process up to the formation of the first wall 50 and the color filter 47 on the backside upper surface of the semiconductor substrate 12 on which a photodiode PD is formed is similar to the first manufacturing method described with reference to FIGS. 7A, 7B, 7C, 7D, and 7E.

Then, as shown in FIG. 11A, an on-chip lens material 121 is applied to the upper surface of the first wall 50 formed on the backside upper surface of the semiconductor substrate 12 and the color filter 47, so that the on-chip lens material 121 has a film thickness equivalent to the second wall 100 formed later, i.e., a film thickness of about 500 nm corresponding to the residual film after on-chip lens 48 lens formation.

Next, as shown in FIG. 11B, a photoresist 122 is coated on the entire surface with a film thickness of about 620 nm. Of the entire surface, the pixel boundary portion corresponding to the formation position of the second wall 100 is patterned and opened with a width of about 150 nm.

Then, as shown in FIG. 11C, by performing dry etching processing on the basis of the patterned photoresist 122, the on-chip lens material 121 under the opening is removed, and an on-chip lens layer 124 and a groove portion 123 having the same height as the second wall 100 are formed.

Note that the on-chip lens layer 124 and the groove portion 123 may be formed as follows: in a manner similar to a third manufacturing method described below with reference to FIGS. 16A and 16B, a photosensitive resin material is used as the on-chip lens material 121, and a region other than the groove portion 123 is exposed and cured.

Next, as shown in FIG. 11D, a low refractive index organic material 125 which is to be the second wall 100 is applied to the groove portion 123 between the on-chip lens layers 124 so that the low refractive index organic material 125 is sufficiently embedded therein. Through this application step, the organic material 125 is also applied to the upper surface of the on-chip lens layer 124. Therefore, next, the organic material 125 formed on the top surface of the on-chip lens layer 124 is removed by etch-back processing or chemical mechanical polishing (CMP). As a result, as shown in FIG. 11E, the second wall 100 is completed.

Thereafter, the on-chip lens material 121 is applied again to the upper surface of the on-chip lens layer 124 and the second wall 100, and the coated on-chip lens material 121 is formed into a lens shape by reflow processing or etch-back method, so that the on-chip lens 48 including the previously formed on-chip lens layer 124 is formed as shown in FIG. 11F, and an antireflection film 49 is formed on the surface of the on-chip lens 48.

As a result of the above steps, the pixel 2 of the pixel structure shown in FIG. 9 is completed.

<8. Modification of Pixel Structure of Second Embodiment>

Figure 12:
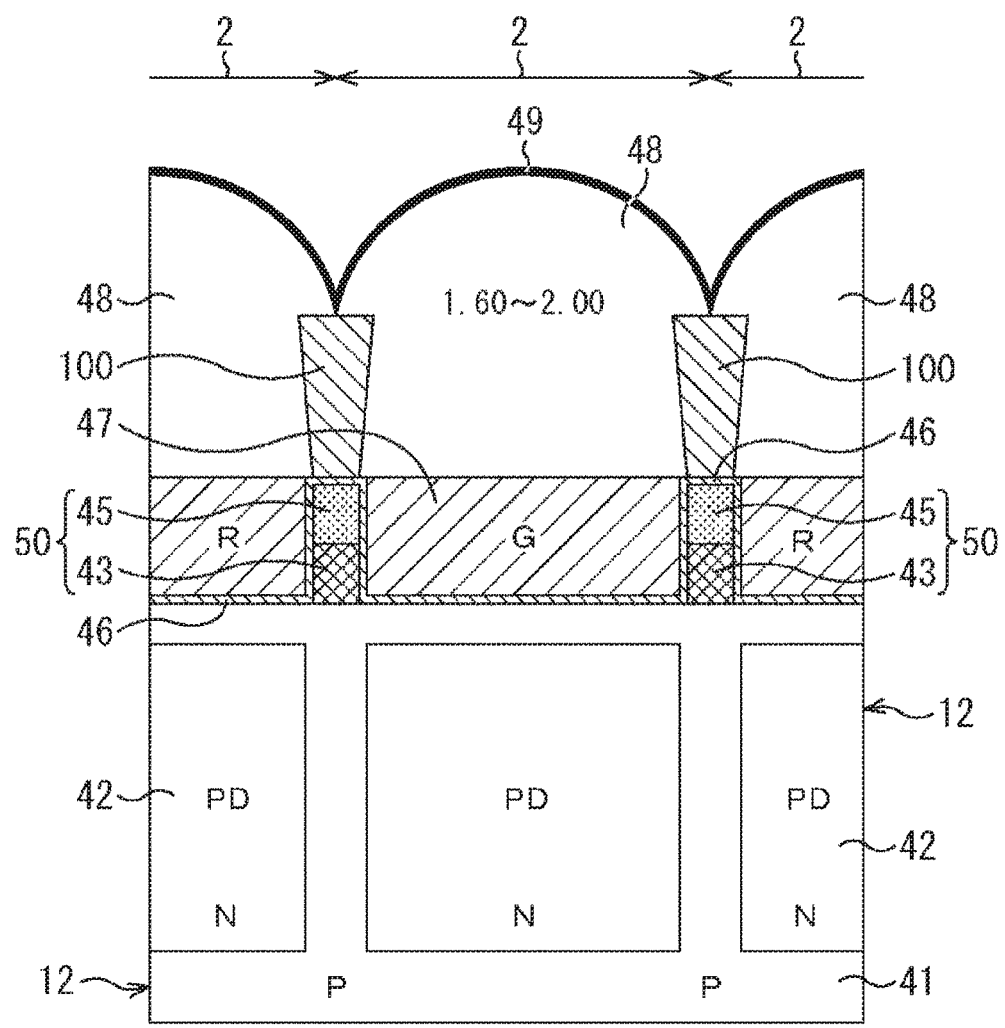
FIG. 12 is a cross-sectional view of pixels showing a first modification of the pixel structure according to the second embodiment.

FIG. 12 is a cross-sectional view of pixels 2 showing a first modification of the pixel structure according to the second embodiment. In FIG. 12, the parts corresponding to FIG. 9 are denoted with the same reference numerals, and the description about those parts is omitted as necessary.

In the modification of the second embodiment shown in FIG. 12, like the modification of the first embodiment, the first low refractive index film 44 is omitted in the first wall 50, and the first wall 50 includes two layers including the light shielding film 43 and the second low refractive index film 45.

In the second embodiment, the first wall 50 may also include a plurality of layers as long as the first wall 50 includes two or more layers including the light shielding film 43 of the lowermost layer. In addition, the second wall 100 may include a plurality of layers instead of one layer. In the first wall 50 and the second wall 100 as a whole, each layer constituting the first wall 50 and the second wall 100 is layered so that the refractive index increases sequentially from the on-chip lens 48 to the semiconductor substrate 12.

In addition, in the pixel structure of the second embodiment shown in FIG. 9, a material having a refractive index of about 1.55 to 1.60 is used as the material of the on-chip lens 48, whereas in the modification of the second embodiment of FIG. 12, a material having a refractive index of about 1.60 to 2.00, which is higher than that, is adopted. By using a material having a high refractive index as the material of the on-chip lens 48 in this manner, the difference in refractive index from the second wall 100 is increased, and color mixing can be further suppressed. Incidentally, also in the first embodiment described above, it is possible to use a material having a high refractive index as the material of the on-chip lens 48.

Figure 13:
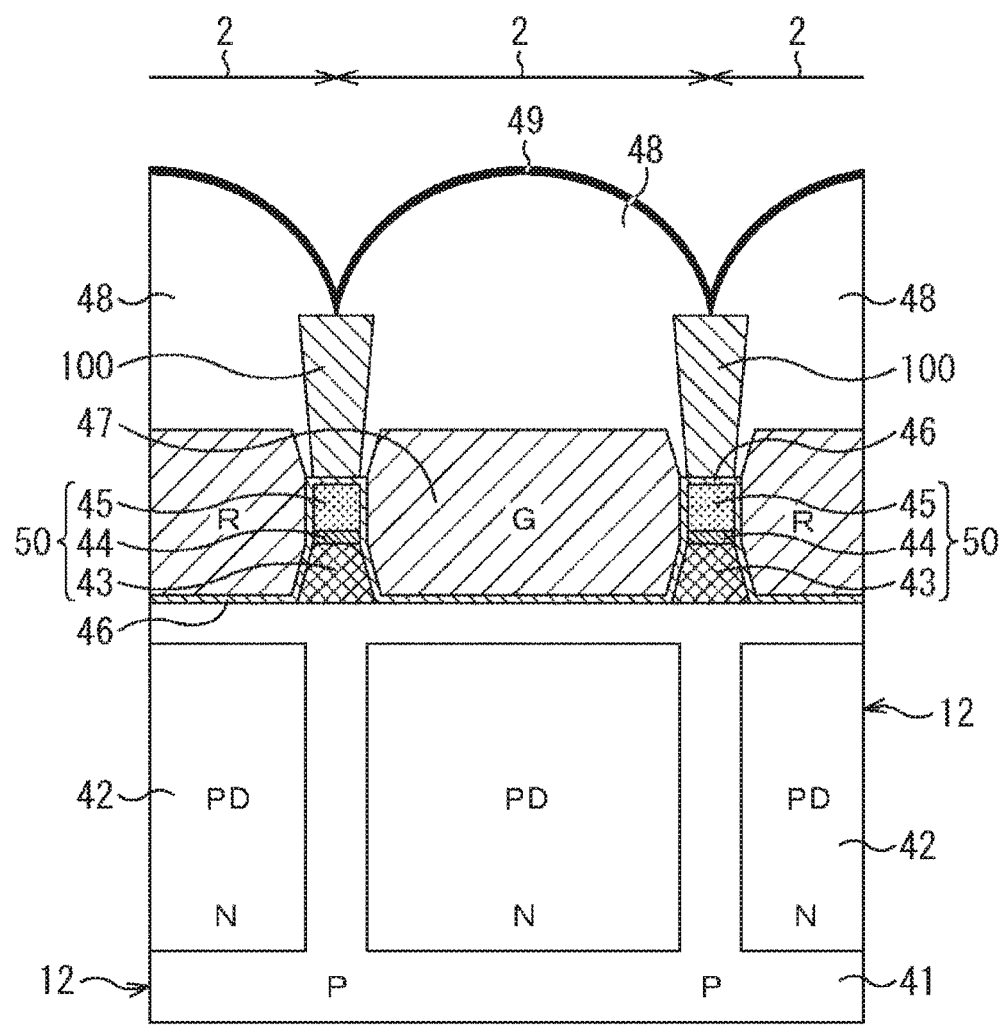
FIG. 13 is a cross-sectional view of pixels showing a second modification of the pixel structure according to the second embodiment.

FIG. 13 is a cross-sectional view of pixels 2 showing a second modification of the pixel structure according to the second embodiment. In FIG. 13, the parts corresponding to FIG. 9 are denoted with the same reference numerals, and the description about those parts is omitted as necessary.

When the pixel structure of the second modification of the second embodiment shown in FIG. 13 and the pixel structure of the second embodiment shown in FIG. 9 are compared, the pixel structure of the second modification of the second embodiment shown in FIG. 13 is different from the pixel structure of the second embodiment shown in FIG. 9 in that the cross sectional shape of the light shielding film 43 is a trapezoidal shape having a wider bottom width than the top width. In addition, the height (film thickness) of the color filter 47 is formed to be higher than the first wall 50, and in the portion higher than the first wall 50, the color filter 47 is in a tapered shape in which the peripheral portion is inwardly inclined. The cross-sectional shape of the color filter 47 and the light shielding film 43 may have such a tilted shape depending on the film thickness to be set. There may be a structure in which the shapes of the color filter 47 and the light shielding film 43 shown in FIG. 13 are appropriately combined with the structures of the other embodiments described above or described later.

<9. Pixel Structure of Third Embodiment>

Figure 14:
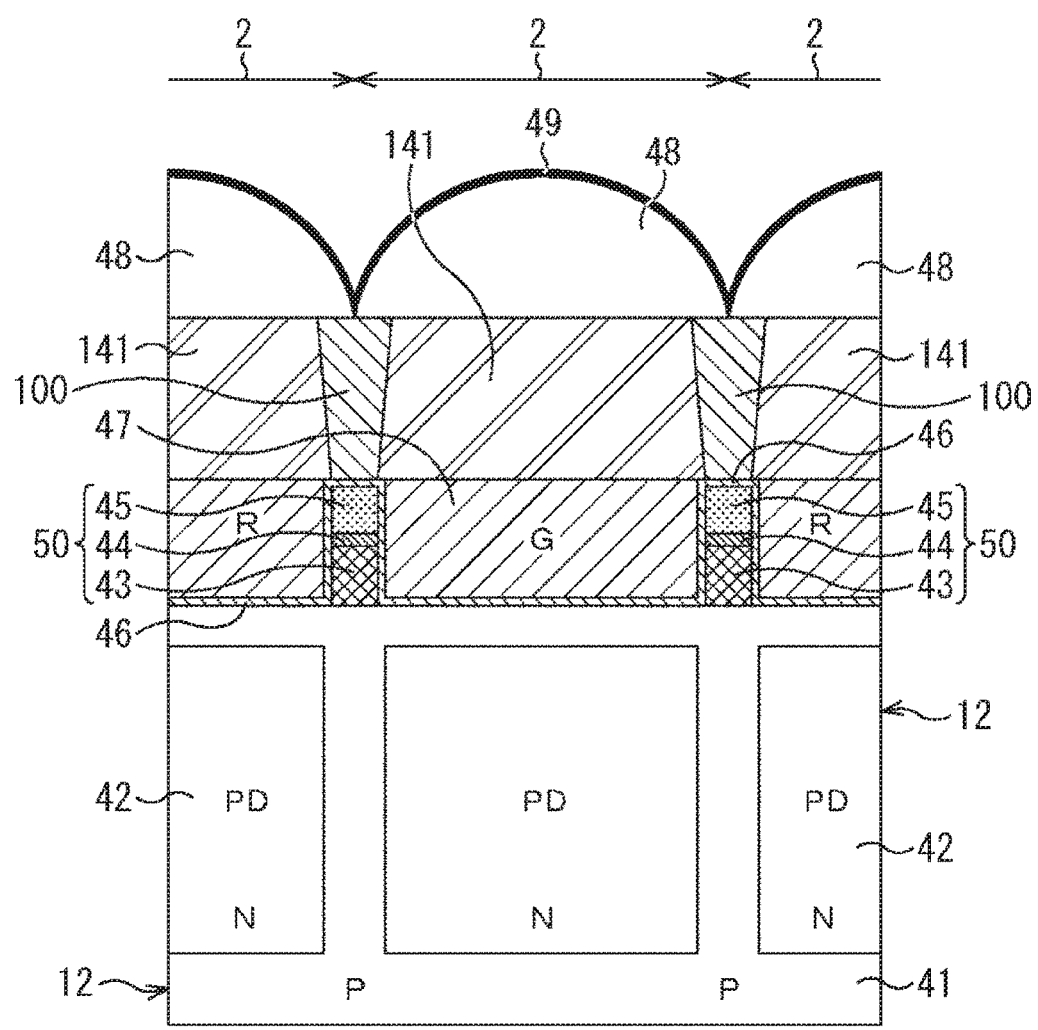
FIG. 14 is a cross-sectional view showing a pixel structure of a third embodiment.

FIG. 14 is a cross-sectional view showing a pixel structure of a third embodiment adopted as the structure of a pixel 2 of a solid-state imaging device 1.

In FIG. 14, the parts corresponding to the first and second embodiments described above are denoted with the same reference numerals, and the description about those parts is omitted as necessary.

In the third embodiment, a second wall 100 is provided on a first wall 50 in a manner similar to the second embodiment shown in FIG. 9. In addition, a high refractive index layer 141 is formed in a region of the same layer region as the second wall 100 on the upper side of a color filter 47. For example, a photosensitive transparent resist or the like having photosensitivity and having a transmittance of 90% or more is used as the material of the high refractive index layer 141. In addition, an on-chip lens 48 and an antireflection film 49 using a material having a still higher refractive index than that of the high refractive index layer 141 are formed on the upper side of the layer including the high refractive index layer 141 and the second wall 100.

Figure 15:
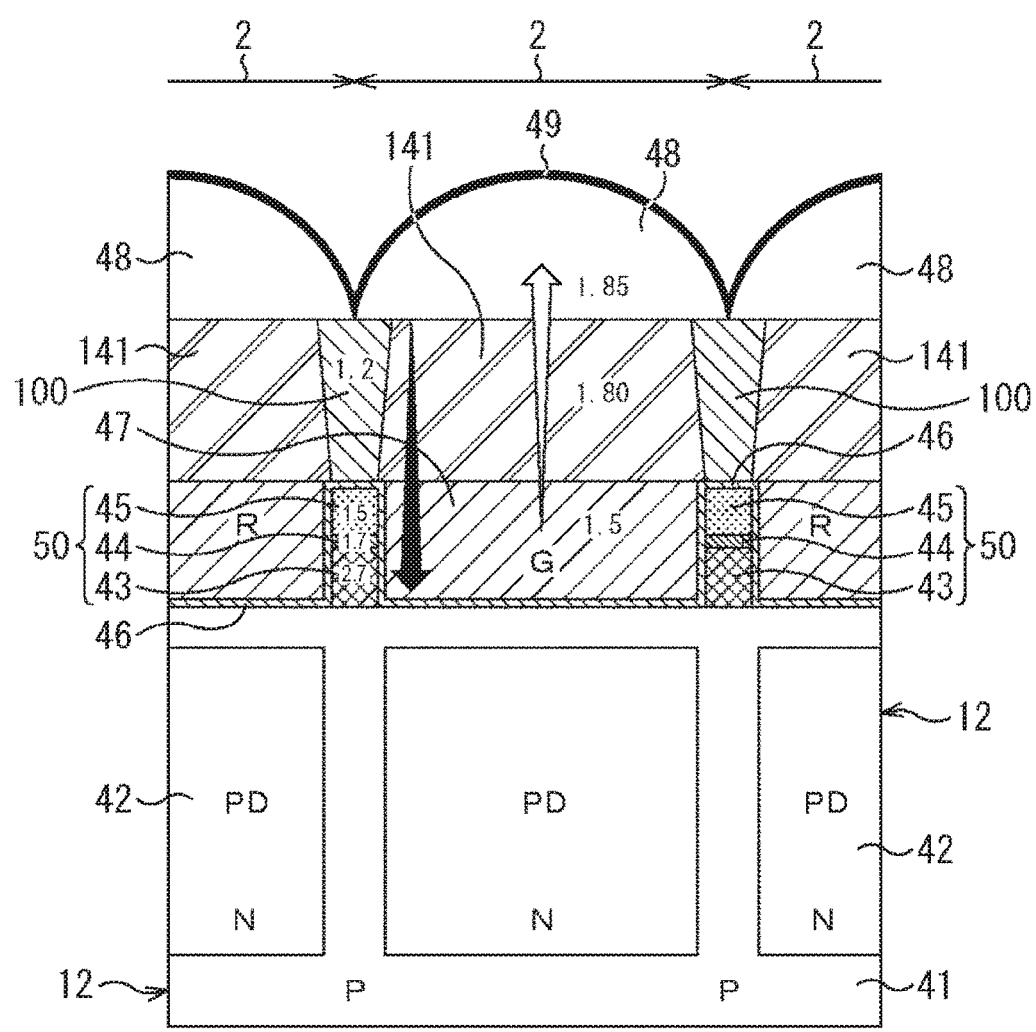

FIG. 15 shows the refractive indexes of the first wall 50 and the second wall 100, the color filter 47, the high refractive index layer 141, and the on-chip lens 48.

Like the second embodiment, the first wall 50 and the second wall 100 are formed such that the refractive index increases sequentially from the on-chip lens 48 to a semiconductor substrate 12.

Specifically, for example, the first wall 50 and the second wall 100 are formed such that the refractive index of the second wall 100 is about 1.2, the refractive index of a second low refractive index film 45 of the first wall 50 is about 1.5, the refractive index of a first low refractive index film 44 is about 1.7, and a light shielding film 43 is formed to have a refractive index of about 2.7.

On the other hand, the color filter 47, the high refractive index layer 141, and the on-chip lens 48 are formed such that the refractive index increases sequentially from the semiconductor substrate 12 to the on-chip lens 48.

Specifically, for example, the refractive index of the color filter 47 is about 1.5, the refractive index of the high refractive index layer 141 is about 1.8, and the refractive index of the on-chip lens 48 is about 1.85.

As described above, a region of the same layer as the second wall 100 is made into the high refractive index layer 141, so that the difference in the refractive index from the adjacent second wall 100 increases and the leakage of incident light to the adjacent pixel can be still more prevented.

<10. Manufacturing Method of Pixel Structure According to Third Embodiment>

A manufacturing method (third manufacturing method) of a pixel 2 according to the third embodiment will be described with reference to FIGS. 16A, 16B, 16C, 16D, 16E, and 16F.

The process up to the formation of the first wall 50 and the color filter 47 on the backside upper surface of the semiconductor substrate 12 on which a photodiode PD is formed is similar to the first manufacturing method described with reference to FIGS. 7A, 7B, 7C, 7D, and 7E.

In addition, as shown in FIG. 16A, a photosensitive transparent resist 151 which is a material of the high refractive index layer 141 is coated on the upper surfaces of the first wall 50 and the color filter 47 formed on the backside upper surface of the semiconductor substrate 12 with a film thickness of, for example, about 500 nm according to the height (film thickness) of the second wall 100 to be formed later. In addition, a photoresist 152 with a width of about 150 nm is patterned at the pixel boundary portion corresponding to the formation position of the second wall 100, and the photosensitive transparent resist 151 on the color filter 47 is cured. Thereafter, by removing the photoresist 152 and the underlying photosensitive transparent resist 151, the high refractive index layer 141 and a groove portion 153 are formed as shown in FIG. 16B.

Next, as shown in C of FIG. 16C, an organic material 125 having the low refractive index which is to be the second wall 100 is applied to the groove portion 153 between the high refractive index layers 141 so that the organic material 125 is sufficiently embedded in the groove portion 153 between the high refractive index layers 141. Thereafter, the organic material 125 on the upper surface of the high refractive index layer 141 is removed by etch-back processing or CMP. As a result, as shown in FIG. 16D, the second wall 100 is formed between the high refractive index layers 141.

In addition, as shown in FIG. 16E, an on-chip lens material 121 is applied to the upper surfaces of the high refractive index layer 141 and the second wall 100, and a photoresist 154 is formed into a lens shape on the further upper surface. By using the lens shaped photoresist 154 as a mask, the lens shape is transferred to the underlying on-chip lens material 121 by dry etching method, so that as shown in FIG. 16F, the on-chip lens 48 is formed. Finally, the antireflection film 49 is formed on the surface of the on-chip lens 48.

As a result of the above steps, the pixel 2 of the pixel structure shown in FIG. 14 is completed.

In the above third manufacturing method, the photosensitive transparent resist 151 is used as the material of the high refractive index layer 141. In this case, the process of FIG. 11C in which the on-chip lens material 121 is etched to form a groove portion 123 in the second manufacturing method can be eliminated, so that the manufacture of the second wall 100 becomes easier.

<11. Modification of Pixel Structure of Third Embodiment>

Figure 17:
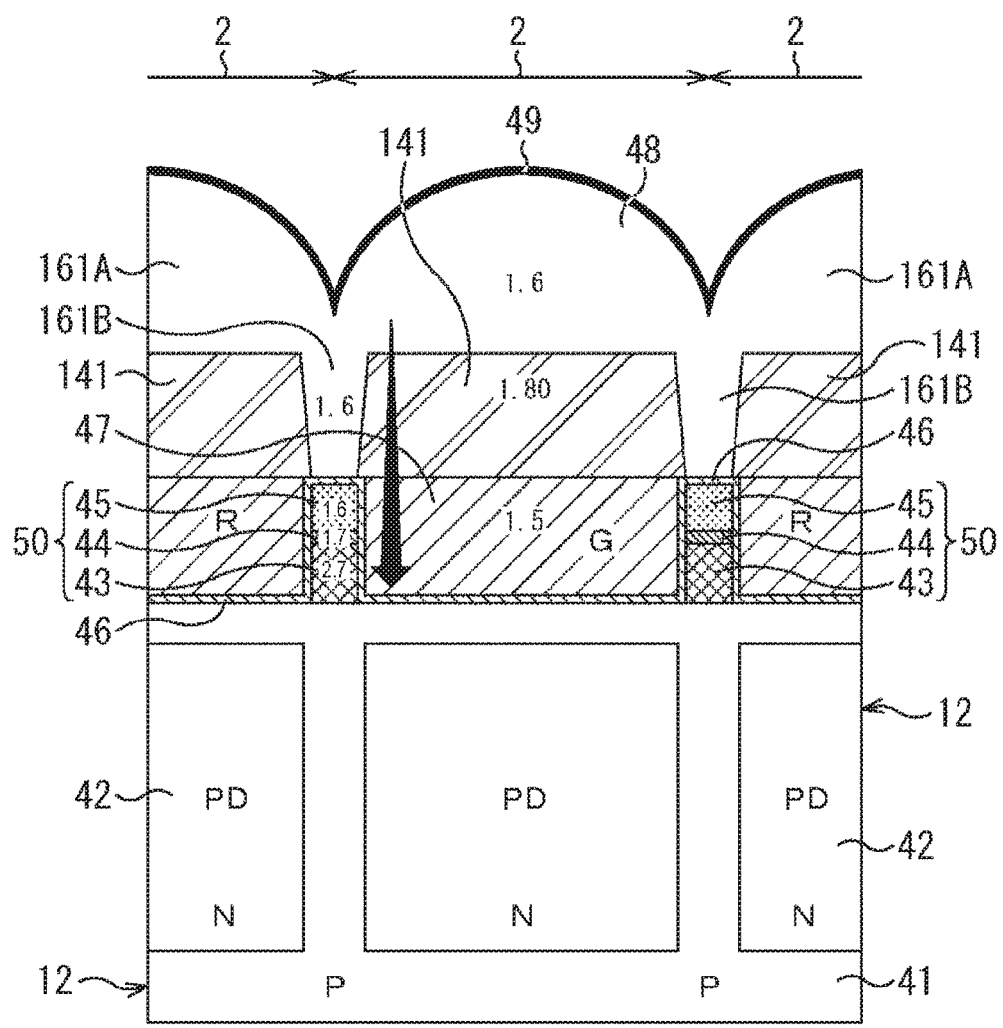
FIG. 17 is a cross-sectional view of pixels showing a modification of the pixel structure according to the third embodiment.

FIG. 17 is a cross-sectional view of pixels 2 showing the modification of the pixel structure according to the third embodiment. In FIG. 17, the parts corresponding to FIG. 14 are denoted with the same reference numerals, and the description about those parts is omitted as necessary.

In the modification of third embodiment shown in FIG. 17, an on-chip lens 161A corresponding to the on-chip lens 48 in FIG. 14 and a second wall 161B corresponding to the second wall 100 in FIG. 14 are formed by using the same on-chip lens material.

For example, as shown in FIG. 17, an organic material or an inorganic material having a refractive index of about 1.60 is used as a material of the on-chip lens 161A and the second wall 161B. In addition, the second low refractive index film 45, the first low refractive index film 44, and the light shielding film 43 of the first wall 50 are formed to have the refractive indexes of about 1.6, about 1.7, and about 2.7, respectively. The color filter 47 and the high refractive index layer 141 are formed to have the refractive indexes of about 1.5 and about 1.8, respectively.

Therefore, the first wall 50 and the second wall 161B are formed such that the refractive index is the same or the refractive index increases sequentially from the on-chip lens 48 to the semiconductor substrate 12.

In the second wall 161B, it is sufficient that a refractive index difference from the adjacent layer is generated so that the refractive index is lower than that of the adjacent layer (the high refractive index layer 141 in the present embodiment), and therefore, the on-chip lens 161A and the second wall 161B can be formed using the same on-chip lens material as described above in the case where the high refractive index layer 141 is adopted in the upper portion of the color filter 47.

<12. Actions and Effects of First Wall and Second Wall>

Figure 18:
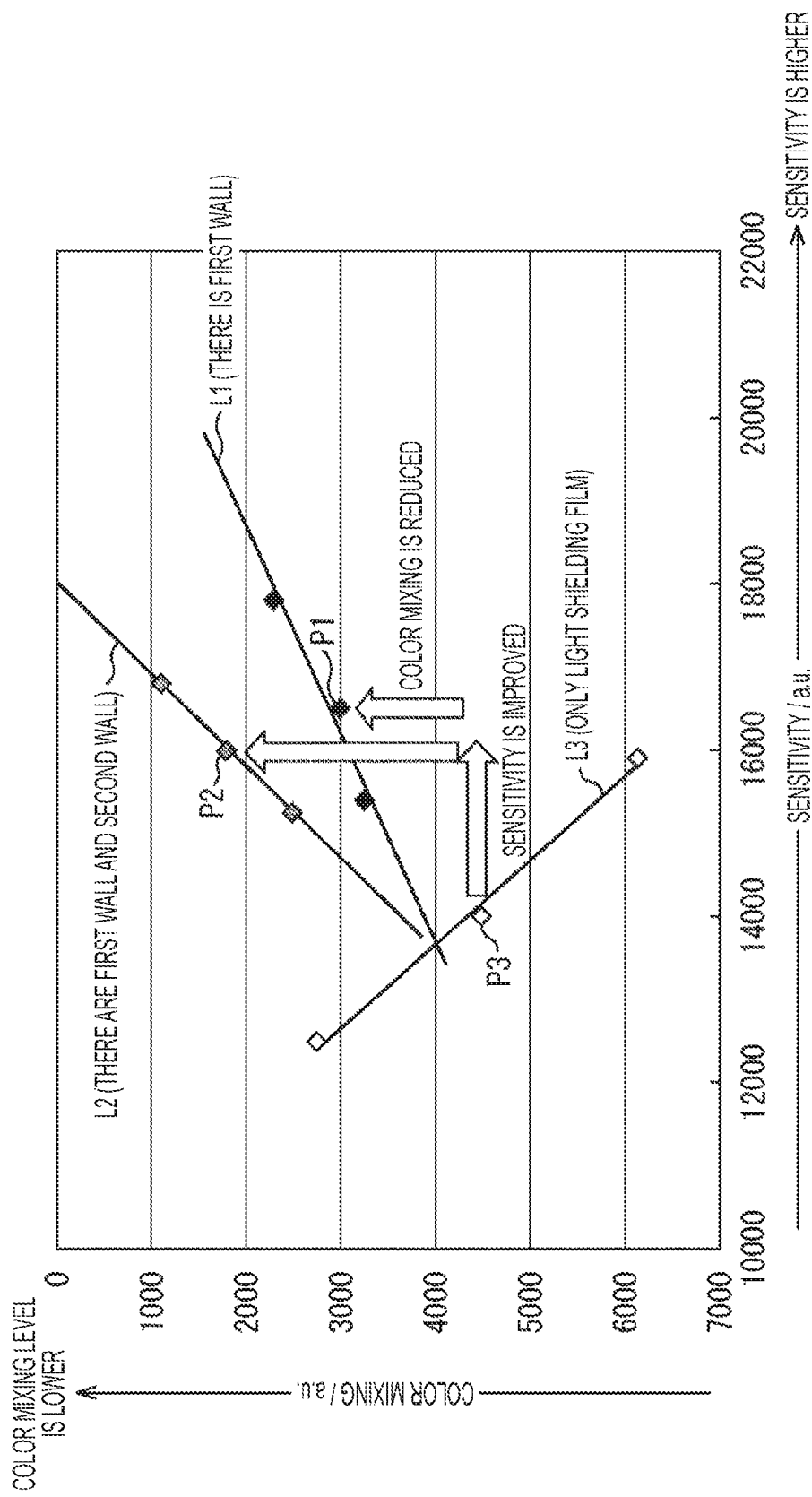
FIG. 18 is an optical simulation result verifying the effect of the first wall and the second wall.

FIG. 18 shows optical simulation results verified by comparing the pixel structures of the above first and second embodiments with the pixel structure where only the inter-pixel light shielding film 301 shown in FIG. 1 is formed.

The graph of FIG. 18 shows approximate straight lines L1 to L3 indicating the relationship between sensitivity level and color mixing level in each of the pixel structure of the first embodiment in which only the first wall 50 is formed, the pixel structure of the second embodiment in which both of the first wall 50 and the second wall 100 are formed, and the pixel structure of FIG. 1 in which only the inter-pixel light shielding film 301 is formed. The horizontal axis of the graph in FIG. 18 represents the sensitivity level and the vertical axis represents the color mixing level.

The approximate straight line L1 is an approximate straight line based on plotting the sensitivity level and color mixing level by changing the refractive indexes of the first low refractive index film 44 and the second low refractive index film 45 of the first wall 50 in the pixel structure of the first embodiment in which only the first wall 50 is formed.

The approximate straight line L2 is an approximate straight line based on plotting the sensitivity level and color mixing level by changing the refractive indexes of the first low refractive index film 44, the second low refractive index film 45, and the second wall 100 in the pixel structure of the second embodiment in which both of the first wall 50 and the second wall 100 are formed.

The approximate straight line L3 is an approximate straight line based on plotting the sensitivity level and color mixing level by changing the height of the inter-pixel light shielding film 301 in the pixel structure of FIG. 1.

It should be noted that a plot P1 used for the calculation of the approximate straight line L1, a plot P2 used for calculating the approximate straight line L2, and a plot P3 used for calculating the approximate straight line L3 are optical simulation results in a case where the height of the light shielding film 43 of the first wall 50 and the height of the inter-pixel light shielding film 301 are set to the same condition of 280 nm.

As can be seen from FIG. 18, in the pixel structure where only the inter-pixel light shielding film 301 is formed, when the height of the inter-pixel light shielding film 301 is increased, color mixing can be suppressed but the sensitivity is greatly reduced.

On the other hand, according to the pixel structure of the first embodiment in which the first low refractive index film 44 and the second low refractive index film 45 of the low refractive index material are provided on the light shielding film 43, the sensitivity can be improved and the color mixing can be reduced as compared with the case where only the inter-pixel light shielding film 301 is provided.

In addition, the pixel structure of the second embodiment further provided with the second wall 100 can also improve the sensitivity and reduce the color mixing as compared with the case where only the inter-pixel light shielding film 301 is provided. In the comparison between the first embodiment and the second embodiment, although the second embodiment is slightly lower than the first embodiment regarding the sensitivity level, the color mixing level is significantly improved in the second embodiment than in the first embodiment.

Therefore, according to the pixel structures of the first to third embodiments to which the present technology is applied, it is possible to increase the condensing efficiency of pixels, and it is possible to reduce leakage of oblique light to adjacent pixels. That is, while improving color mixing, the sensitivity can be improved. Therefore, there is no need to perform extreme pupil correction, and robustness against the lens position shift can be achieved. By reducing the correction amount of pupil correction, the coloring phenomenon of image sensor chip periphery due to color mixing can also be improved.

<13. Application Example to Electronic Device>

The present technology is not limited to application to solid-state imaging devices. That is, the present technology can be applied to all electronic devices using a solid-state imaging device for an image capturing unit (photoelectric conversion unit) such as imaging devices such as digital still cameras and video cameras, portable terminal devices having imaging functions, copying machines using solid-state imaging devices for image reading units, and the like. The solid-state imaging device may be in a form formed as a single chip or in a modular form having an imaging function in which the imaging unit and the signal processing unit or the optical system are packaged together.

Figure 19:
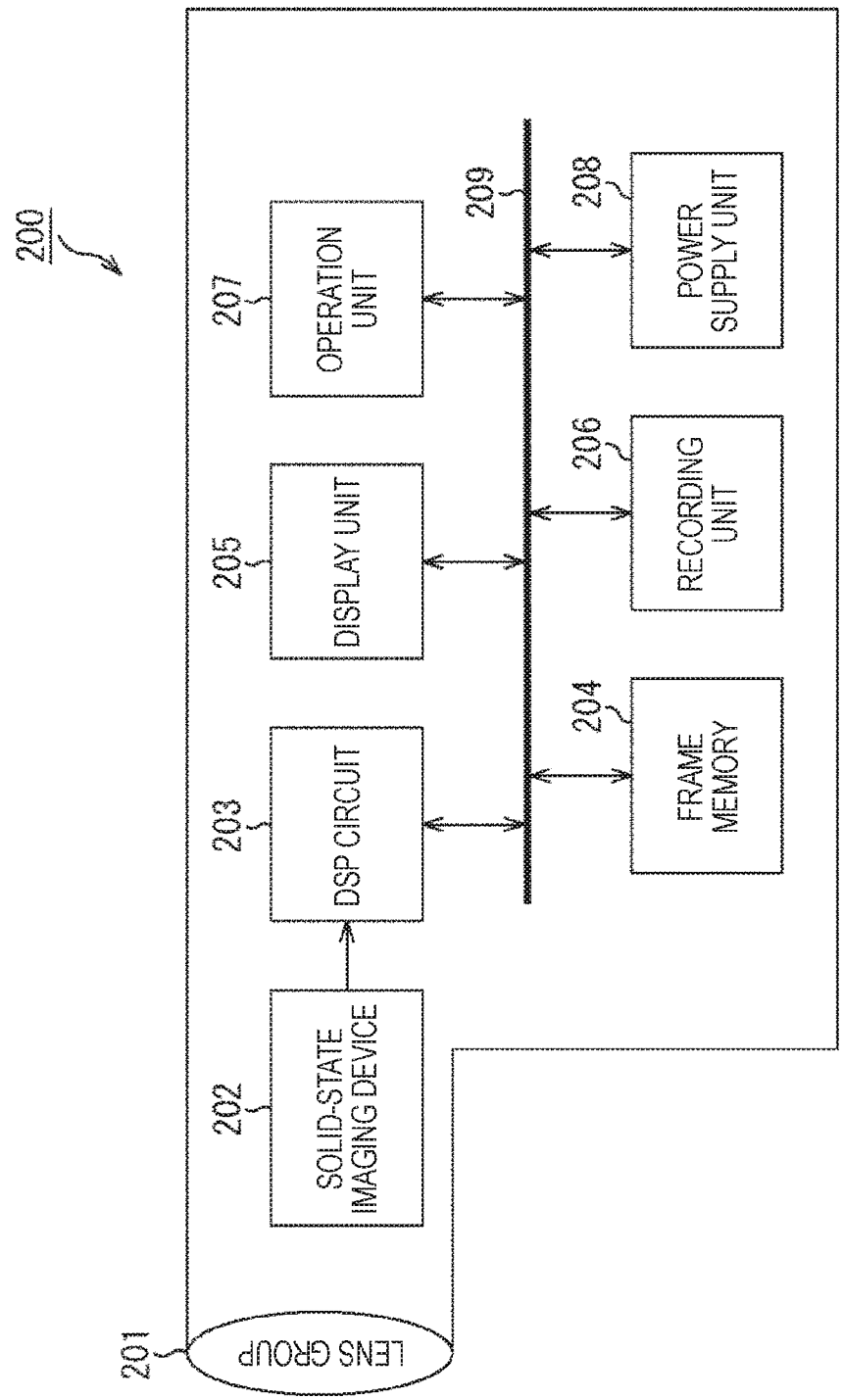
FIG. 19 is a block diagram showing a configuration example of an imaging device serving as an electronic device to which the present technology is applied.

FIG. 19 is a block diagram showing the configuration example of the imaging device as an electronic device to which the present technology is applied.

An imaging device 200 in FIG. 19 includes an optical unit 201 including a lens group and the like, a solid-state imaging device (imaging device) 202 in which the configuration of the solid-state imaging device 1 in FIG. 4 is employed, and a DSP (Digital Signal Processor) circuit 203 which is a camera signal processing circuit. In addition, the imaging device 200 also includes a frame memory 204, a display unit 205, a recording unit 206, an operation unit 207, and a power supply unit 208. The DSP circuit 203, the frame memory 204, the display unit 205, the recording unit 206, the operation unit 207, and the power supply unit 208 are connected to each other via a bus line 209.

The optical unit 201 captures incident light (image light) from the object and forms an image on the imaging surface of the solid-state imaging device 202. The solid-state imaging device 202 converts the light amount of the incident light imaged on the imaging surface by the optical unit 201 into electric signals in pixel units and outputs the electric signals as pixel signals. The solid-state imaging device 1 of FIG. 4 can be used as this solid-state imaging device 202, and more specifically, the solid-state imaging device having the pixel structure of the first embodiment having the first wall 50 including the first low refractive index film 44 and the second low refractive index film 45 of the low refractive index material or the pixel structure of the second embodiment or the third embodiment including the first wall 50 and the second wall 100 can be used as this solid-state imaging device 202.

The display unit 205 includes a panel type display device such as a liquid crystal panel or an organic EL (Electro Luminescence) panel, for example, and displays a moving image or a still image imaged by the solid-state imaging device 202. The recording unit 206 records the moving image or the still image imaged by the solid-state imaging device 202 on a recording medium such as a hard disk or a semiconductor memory.

The operation unit 207 issues an operation command for various functions of the imaging device 200 under user's operation. The power supply unit 208 appropriately supplies various power supplies serving as operation power sources for the DSP circuit 203, the frame memory 204, the display unit 205, the recording unit 206, and the operation unit 207 to these supply targets.

As described above, by using the solid-state imaging device 1 having the pixel structure of any one of the aforementioned first to third embodiments as the solid-state imaging device 202, it is possible to improve the sensitivity and greatly reduce the color mixing. Therefore, even in the imaging device 200 for such as a video camera, a digital still camera, and furthermore a camera module for a mobile device such as a cellular phone, the imaging quality of the imaging image can be improved.

<Usage Example of Image Sensor>

Figure 20:
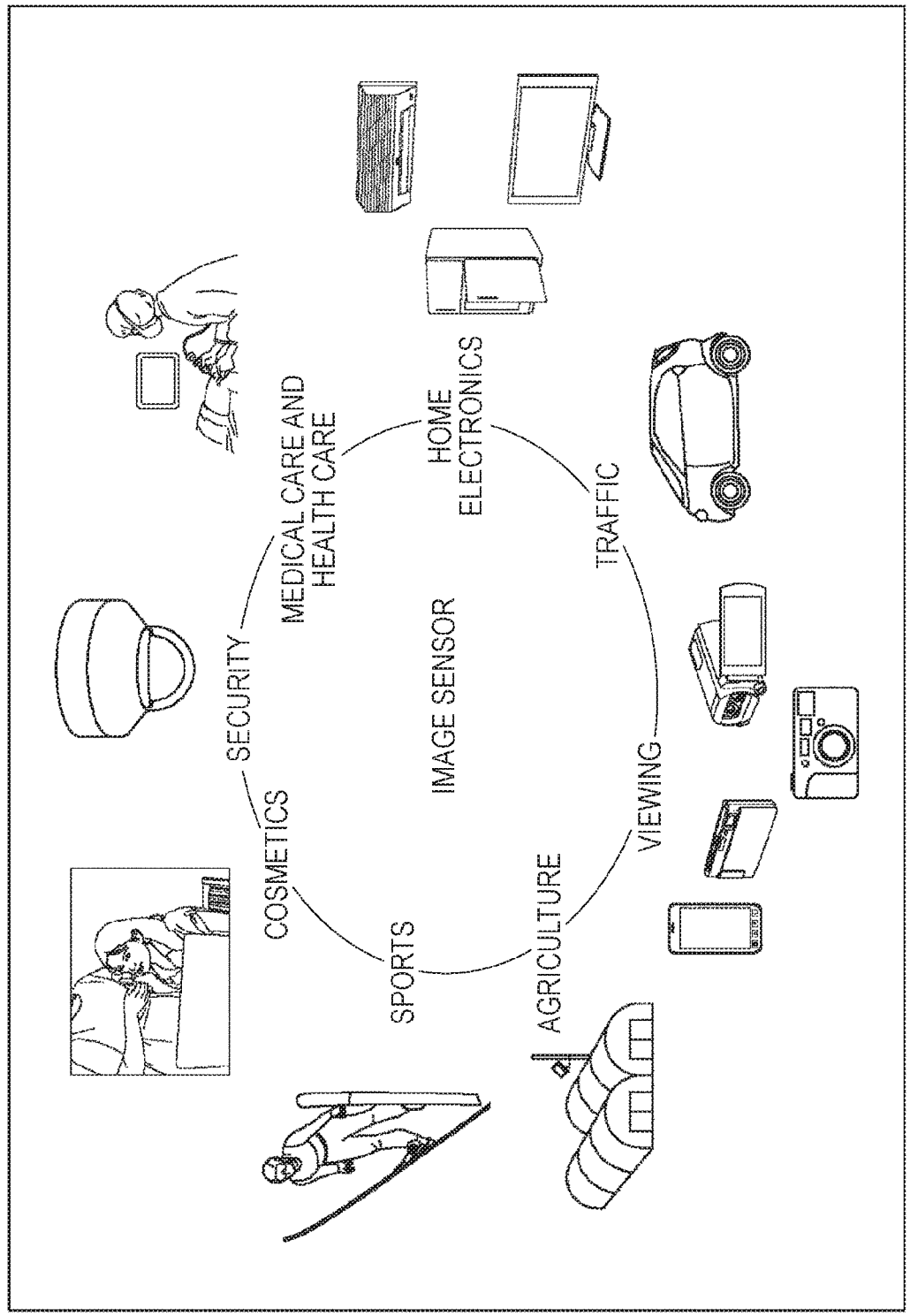
FIG. 20 is a figure for explaining an example of use of a solid-state imaging device in FIG. 4.

FIG. 20 shows an example of use in which the solid-state imaging device 1 described above is used as an image sensor.

The image sensor using the above-described configuration of the solid-state imaging device 1 can be used for various cases of sensing light such as, visible light, infrared rays, ultraviolet light, X rays, and the like as follows.

- A digital camera, a mobile device with a camera function, and the like to take pictures which are to be viewed
- Device provided for the use in relation to traffic such as an in-vehicle sensor for imaging, e.g., the front, the back, the periphery, and the inside of an automobile for safe driving such as automatic stop and recognition of the state of the driver and the like, a surveillance camera for monitoring traveling vehicles and roads, a distance measuring sensor for distance measurement of a distance between vehicles and the like
- Devices provided for the use in relation to home electronics of a TV, a refrigerator, an air conditioner, and the like in order to photograph a user's gesture and operate the equipment according to the gesture
- Devices provided for the use in relation to medical care and health care such as endoscope and device for performing angiography by receiving infrared rays
- Devices provided for the use in relation to security such as surveillance cameras for security applications, and cameras for person authentication usage
- Devices provided for the use in relation to cosmetic purposes such as skin measuring devices for photographing the skin, and microscopes for photographing the scalp
- Devices provided for the use in relation to sports and the like such as action camera for sports usage, and wearable cameras
- Devices provided for the use in relation to agriculture such as cameras for monitoring the condition of fields and crops In the above example, the solid-state imaging device in which the first conductivity type is P type, the second conductivity type is N type, and electrons are signal charges has been described, but the present technology can also be applied to solid-state imaging devices in which holes are signal charges. In other words, the first conductivity type may be N type, and the second conductivity type may be P type, so that the aforementioned semiconductor regions include semiconductor regions of opposite conductivity types.

In addition, the present technology is not limited to application to the solid-state imaging device that detects the distribution of the amount of incident light of visible light and captures the distribution as an image. The present technology can be applied to solid-state imaging devices (physical quantity distribution detection devices) in general such as a solid-state imaging device that images the distribution of the incident amount of infrared rays, X-rays, particles or the like as an image, and, as a meaning in a broad sense, a fingerprint detection sensor or the like for detecting the distribution of other physical quantities such as pressure and electrostatic capacity and capturing the distribution as an image.

In addition, the present technology is applicable not only to solid-state imaging devices but also to all semiconductor devices having other semiconductor integrated circuits in general.

The embodiment of the present technology is not limited to the above-described embodiments, and various modifications are possible without departing from the gist of the present technology.

For example, it is possible to adopt a form in which all or some of the above-described plurality of embodiments are combined.

For example, in the first embodiment described above, the height of the first wall 50 is made substantially equal to the height of the color filter 47, and in the second embodiment, the height of the second wall 100 is made substantially the same as the height of the high refractive index layer 141, but the height of the first wall 50 and the height of the second wall 100 do not necessarily have to match the height of the color filter 47 or the height of the high refractive index layer 141. For example, the height of the first wall 50 may be lower than the height of the color filter 47, and the thickness (height) of the second wall 100 may be formed to be thick accordingly. In other words, in the pixel structure of the present technology, at least one layer of pixel isolation wall is formed on the light shielding film 43 arranged at the pixel boundary, and it is only necessary that the refractive index of each layer of the one or more layers of the pixel isolation wall is formed to have a refractive index that is lower than the light shielding film 43 and that increases sequentially from the on-chip lens 48 to the semiconductor substrate 12.

The effects described in this specification are merely examples and are not intended to be limiting, and may have effects other than those described in the present specification.

It should be noted that the present technology can also have the following configuration.

(1)

A solid-state imaging device including a first wall provided between a pixel and a pixel arranged two-dimensionally to isolate the pixels, in which the first wall includes at least two layers including a light shielding film of a lowermost layer and a low refractive index film of which refractive index is lower than the light shielding film.

(2)

The solid-state imaging device according to (1), in which the light shielding film includes a metal film.

(3)

The solid-state imaging device according to (1) or (2), in which the low refractive index film includes a laminated layer including a first low refractive index film and a second low refractive index film, and a refractive index increases in a following order: the second low refractive index film, the first low refractive index film which is below the second low refractive index film, and the light shielding film which is the lowermost layer.

(4)

The solid-state imaging device according to (3), in which the first low refractive index film and the second low refractive index film include an inorganic film or an organic film.

(5)

The solid-state imaging device according to any one of (1) to (4), in which the first wall is formed to have the same height as an adjacent color filter.

(6)

The solid-state imaging device according to any one of (1) to (5), in which the first wall is covered with a protective film to prevent corrosion.

(7)

The solid-state imaging device according to any one of (1) to (6), further including a second wall provided at an upper side of the first wall to isolate the pixels.

(8)

The solid-state imaging device according to (7), in which the second wall is provided between the on-chip lens of the pixels.

(9)

The solid-state imaging device according to (7) or (8), in which a cross sectional shape of the second wall is a reverse trapezoidal shape having a thinner bottom width than a top width.

(10)

The solid-state imaging device according to any one of (7) to (9), in which the second wall includes an inorganic film or an organic film.

(11)

The solid-state imaging device according to any one of (7) to (10), in which a refractive index of the second wall is lower than a refractive index of an adjacent layer.

(12)

The solid-state imaging device according to any one of (7) to (11), in which the second wall is formed using the same material as the on-chip lens.

(13)

The solid-state imaging device according to any one of (1) to (12), in which a refractive index of the on-chip lens is in a range of 1.60 to 2.00.

(14)

The solid-state imaging device according to any one of (1) to (13), in which in each pixel, a color filter, a high refractive index layer, and an on-chip lens are layered in this order on an upper side of a photoelectric conversion unit formed on a semiconductor substrate, and the color filter, the high refractive index layer, and the on-chip lens are formed to have refractive indexes that increase from the semiconductor substrate to the on-chip lens.

(15)

A manufacturing method of a solid-state imaging device, in which a first wall is formed between a pixel and a pixel arranged two-dimensionally to isolate the pixels, and the first wall includes at least two layers including a light shielding film of a lowermost layer and a low refractive index film of which refractive index is lower than the light shielding film.

(16)

An electronic device including a solid-state imaging device including a first wall provided between a pixel and a pixel arranged two-dimensionally to isolate the pixels, in which the first wall includes at least two layers including a light shielding film of a lowermost layer and a low refractive index film of which refractive index is lower than the light shielding film.

REFERENCE SIGNS LIST

PD photodiode
1 solid-state imaging device
2 pixel
3 pixel array unit
12 semiconductor substrate
43 light shielding film
44 first low refractive index film
45 second low refractive index film
46 protective film
47 color filter
48 on-chip lens
49 antireflection film
50 first wall
100 second wall
141 high refractive index layer
161A on-chip lens
161B second wall
200 imaging device
202 solid-state imaging device

The invention claimed is:

1. A solid-state imaging device, comprising:
a plurality of pixels including a first pixel and a second pixel, wherein
the first pixel and the second pixel are adjacent pixels, and
the plurality of pixels is in a two-dimensional arrangement; and
a first wall between the first pixel and the second pixel, wherein
the first wall isolates the first pixel from the second pixel,
the first wall includes a light shielding film, a first low refractive index film, and a second low refractive index film,
each of a first refractive index of the first low refractive index film and a second refractive index of the second low refractive index film is lower than a third refractive index of the light shielding film, and
each of the first low refractive index film and the second low refractive index film is on the light shielding film.

2. The solid-state imaging device according to claim 1, wherein the light shielding film includes a metal film.

3. The solid-state imaging device according to claim 1, wherein
the second refractive index is lower than the first refractive index, and
the second low refractive index film is on the first low refractive index film.

4. The solid-state imaging device according to claim 3, wherein each of the first low refractive index film and the second low refractive index film includes one of an inorganic film or an organic film.

5. The solid-state imaging device according to claim 1, wherein
a first height of the first wall is equal to a second height of a color filter, and
the color filter is adjacent to the first wall.

6. The solid-state imaging device according to claim 1, further comprising a protective film that covers the first wall to prevent corrosion.

7. The solid-state imaging device according to claim 1, further comprising a second wall at an upper side of the first wall, wherein the second wall isolates the first pixel from the second pixel.

8. The solid-state imaging device according to claim 7, wherein the second wall is between an on-chip lens of the first pixel and an on-chip lens of the second pixel.

9. The solid-state imaging device according to claim 7, wherein
a cross sectional shape of the second wall is a reverse trapezoidal shape, wherein a bottom width of the second wall is thinner than a top width of the second wall.

10. The solid-state imaging device according to claim 7, wherein the second wall includes one of an inorganic film or an organic film.

11. The solid-state imaging device according to claim 7, wherein
a fourth refractive index of the second wall is lower than the second refractive index of the second low refractive index film, and
the second low refractive index film is adjacent to the second wall.

12. The solid-state imaging device according to claim 7, wherein each of the second wall and an on-chip lens of the first pixel includes same material.

13. The solid-state imaging device according to claim 1, wherein a fifth refractive index of an on-chip lens of the first pixel is in a range of 1.60 to 2.00.

14. The solid-state imaging device according to claim 1, wherein
each pixel of the plurality of pixels includes a color filter, a high refractive index layer, and an on-chip lens layered in order on an upper side of a photoelectric conversion unit,
the photoelectric conversion unit is on a semiconductor substrate, and
refractive indices of the color filter, the high refractive index layer, and the on-chip lens increase from the semiconductor substrate to the on-chip lens.

15. A manufacturing method of a solid-state imaging device, the manufacturing method comprising:
forming a first wall between a first pixel of a plurality of pixels and a second pixel of the plurality of pixels, wherein
the plurality of pixels is in a two-dimensional arrangement,
the first pixel and the second pixel are adjacent pixels,
the first wall isolates the first pixel from the second pixel,
first wall includes a light shielding film, a first low refractive index film, and a second low refractive index film,
each of a first refractive index of the first low refractive index film and a second refractive index of the second low refractive index film is lower than a third refractive index of the light shielding film, and
each of the first low refractive index film and the second low refractive index film is on the light shielding film.

16. An electronic device, comprising:
a solid-state imaging device including:
a plurality of pixels including a first pixel and a second pixel, wherein
the first pixel and the second pixel are adjacent pixels, and
the plurality of pixels is in a two-dimensional arrangement; and
a first wall between the first pixel and the second pixel, wherein
the first wall isolates the first pixel from the second pixel,
the first wall includes a light shielding film, a first low refractive index film, and a second low refractive index film,
each of a first refractive index of the first low refractive index film and a second refractive index of the second low refractive index film is lower than a third refractive index of the light shielding film, and
each of the first low refractive index film and the second low refractive index film is on the light shielding film.

* * * * *